US012796207B2

(12) United States Patent
Ha et al.

(10) Patent No.: US 12,796,207 B2

(45) Date of Patent: Nov. 10, 2026

(54) ORGANIC LIGHT EMITTING DIODE AND ORGANIC LIGHT EMITTING DEVICE

(71) Applicant: LG Display Co., Ltd., Seoul (KR)

(72) Inventors: Jun-Su Ha, Paju-si (KR); Shin-Young Jeong, Paju-si (KR); Yu-Jeong Lee, Paju-si (KR); Hyun-Jin Cho, Paju-si (KR); Eun-Jung Park, Paju-si (KR); Ju-Hyuk Kwon, Paju-si (KR); Jang-Dae Youn, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 520 days.

(21) Appl. No.: 18/239,882

(22) Filed: Aug. 30, 2023

(65) Prior Publication Data

US 2024/0276747 A1 Aug. 15, 2024

(30) Foreign Application Priority Data

Jan. 26, 2023 (KR) ........................ 10-2023-0009854

(51) Int. Cl.

| | |
|---|---|
| ***H10K 50/11*** | (2023.01) |
| ***C09K 11/02*** | (2006.01) |
| ***C09K 11/06*** | (2006.01) |
| ***H10K 50/13*** | (2023.01) |
| ***H10K 85/60*** | (2023.01) |
| *H10K 101/30* | (2023.01) |
| *H10K 101/40* | (2023.01) |

(52) U.S. Cl.

CPC .............. *H10K 50/11* (2023.02); *C09K 11/02* (2013.01); *C09K 11/06* (2013.01); *H10K 50/131* (2023.02); *H10K 85/622* (2023.02); *H10K 85/626* (2023.02); *H10K 85/6574* (2023.02); *H10K 2101/30* (2023.02); *H10K 2101/40* (2023.02)

(58) Field of Classification Search

None

See application file for complete search history.

(56) References Cited

U.S. PATENT DOCUMENTS

| | | | | |
|---|---|---|---|---|
| 2005/0093433 | A1 | 5/2005 | Ko | |
| 2015/0280158 | A1 | 10/2015 | Ogiwara et al. | |
| 2020/0259086 | A1* | 8/2020 | Kim ..................... | H10K 85/622 |
| 2022/0407028 | A1* | 12/2022 | Lee ...................... | H10K 50/156 |

FOREIGN PATENT DOCUMENTS

| | | | |
|---|---|---|---|
| EP | 4 080 597 | A1 | 10/2022 |
| KR | 10-1614403 | B1 | 4/2016 |
| KR | 10-2022-0063369 | A | 5/2022 |

* cited by examiner

*Primary Examiner* — Hung K Vu

(74) *Attorney, Agent, or Firm* — Birch, Stewart, Kolasch & Birch, LLP

(57) ABSTRACT

An organic light emitting diode (OLED) and an organic light emitting device comprising the OLED (e.g., a display device or a lighting device) are described. The OLED can include a first blue emitting material layer including a first host, and a second blue emitting material layer including a second host, disposed between two electrodes. The OLED includes two blue emitting material layers so that an exciton recombination zone is distributed within the blue emitting material layers irrespective of current density or gradation. As the amount of non-emitting excitons accumulated outside of the emitting material layers is minimized, the driving voltage of the OLED can be lowered, and the luminous efficiency and the luminous lifespan of the OLED can be improved.

21 Claims, 12 Drawing Sheets

ORGANIC LIGHT EMITTING DIODE AND ORGANIC LIGHT EMITTING DEVICE

CROSS-REFERENCE TO RELATED APPLICATIONS

This application claims priority, under 35 U.S.C. § 119(a), to Korean Patent Application No. 10-2023-0009854, filed in the Republic of Korea on Jan. 26, 2023, the entire contents of which are hereby expressly incorporated by reference into the present application.

BACKGROUND

Technical Field

The present disclosure relates to an organic light emitting diode (OLED), and more particularly, t, an OLED that has low power consumption, improved luminous efficiency and/or luminous lifespan, as well as to an organic light emitting device including the OLED (e.g., a display device or a lighting device).

Description of the Related Art

Flat panel display devices including an organic light emitting diode (OLED) are increasingly being used in various applications, and have various advantages over a liquid crystal display device (LCD). For instance, the OLED can be formed as a thin organic film and the electrode configurations can implement unidirectional or bidirectional images. Also, the OLED can be formed even on a flexible transparent substrate, e.g., such as a plastic substrate, so that a flexible or a foldable display device can easily be provided using the OLED.

In addition, the OLED can be driven at a lower voltage and the OLED has advantageous high color purity compared to an LCD.

However, there remains a need to develop OLEDs and devices thereof that have improved luminous efficiency and luminous lifespan. Since fluorescent materials use only singlet excitons in the luminous process, there is an issue with low luminous efficiency.

Meanwhile, phosphorescent materials can show a high luminous efficiency since they use triplet exciton as well as singlet excitons in the luminous process. But, examples of such phosphorescent material include metal complexes, which can have a luminous lifespan that is too short for commercial use. As such, there remains a need to develop an OLED with sufficient luminous efficiency and luminous lifespan.

SUMMARY OF THE DISCLOSURE

Embodiments of the present disclosure are directed to an organic light emitting diode and an organic light emitting device that substantially obviate one or more of the problems due to the limitations and disadvantages of the related art.

An organic light-emitting diode according to aspects of the present disclosure can operate at a low voltage, consume less power, render excellent colors, and/or can be used in a variety of applications. In an aspect, the OLED can also be formed on a flexible substrate, to provide a flexible or a foldable device. Further, the size of the OLED can be easily adjustable.

An object of the present disclosure is to provide an organic light emitting diode that can implement beneficial color properties by minimizing color changes irrespective of gradation changes, as well as an organic light emitting device including the diode.

Another object of the present disclosure is to provide an organic light emitting diode that can implement low power consumption and has beneficial luminous efficiency and luminous lifespan, as well as an organic light emitting device including the diode.

Additional features and aspects will be set forth in the description that follows, and in part will be apparent from the description, or can be learned by practice of the disclosed concepts provided herein. Other features and aspects of the disclosed concept can be realized and attained by the structure particularly pointed out in the written description, or derivable therefrom, and the claims hereof as well as the appended drawings.

To achieve these and other advantages and in accordance with objects of the disclosure, as embodied and broadly described herein, in one aspect, the present disclosure provides an organic light emitting diode that includes a first electrode; a second electrode facing the first electrode; and an emissive layer disposed between the first electrode and the second electrode, and including at least one emitting material layer, wherein the at least one emitting material layer comprises: a first blue emitting material layer including a first host; and a second blue emitting material layer disposed between the first blue emitting material layer and the second electrode, and including a second host, wherein the first host comprises an organic compound having the following structure of Chemical Formula 1, and wherein the second host comprises an organic compound having the following structure of Chemical Formula 3:

[Chemical Formula 1]

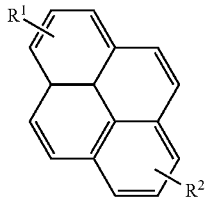

wherein, in the Chemical Formula 1, each of $R^1$ and $R^2$ is independently hydrogen, an unsubstituted or substituted $C_1$-$C_{20}$ alkyl group, an unsubstituted or substituted $C_6$-$C_{30}$ aryl group or an unsubstituted or substituted $C_3$-$C_{30}$ hetero aryl group,

[Chemical Formula 3]

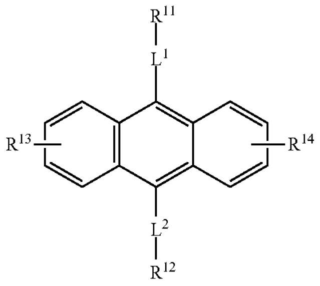

wherein, in the Chemical Formula 3, each of $R^{11}$ and $R^{12}$ is independently an unsubstituted or substituted $C_6$-$C_{30}$ aryl group or an unsubstituted or substituted $C_3$-$C_{30}$ hetero aryl group, each of $R^{13}$ and $R^{14}$ is independently hydrogen, an unsubstituted or substituted $C_1$-$C_{20}$ alkyl group, an unsubstituted or substituted $C_6$-$C_{30}$ aryl group or an unsubstituted or substituted $C_3$-$C_{30}$ hetero aryl group; and each of $L^1$ and $L^2$ is independently a single bond, an unsubstituted or substituted $C_5$-$C_{30}$ arylene group or an unsubstituted or substituted $C_3$-$C_{30}$ hetero arylene group.

In an aspect, in the Chemical Formula 1, each of $R^1$ and $R^2$ is independently hydrogen, methyl, ethyl, propyl, butyl, phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl or spiro-fluorenyl.

In an aspect, in the Chemical Formula 1, each of $R^1$ and $R^2$ is independently hydrogen, methyl, ethyl, propyl, butyl, pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, dihydroacridinyl substituted with at least one $C_1$-$C_{10}$ alkyl or N-substituted spiro fluorenyl.

In an aspect, each of $R^1$ and $R^2$ is independently:

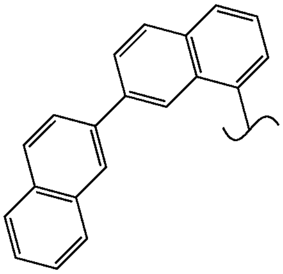
,
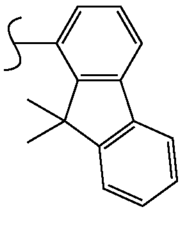
,
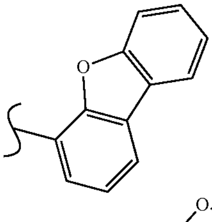
,
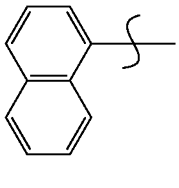
,
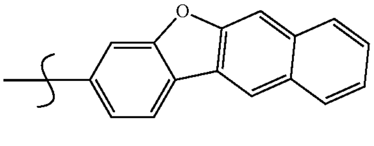
,

-continued

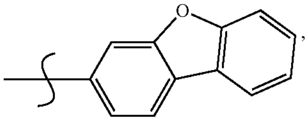
,
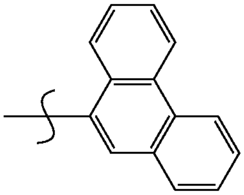
,
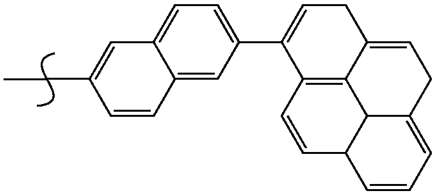
,
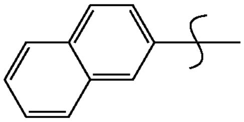
,
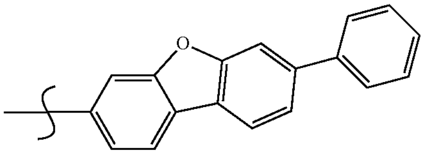
,
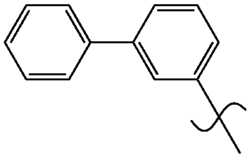
,
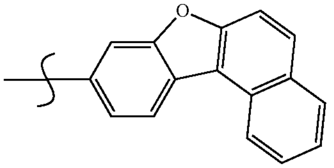
, or
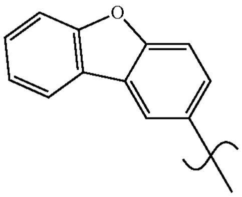
.

In an aspect, in the Chemical Formula 3, each of $R^{11}$ and $R^{12}$ is independently phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl, spiro-fluorenyl, pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, or dihydroacridinyl.

In an aspect, in the Chemical Formula 3, each of $L^1$-$R^{11}$ is independently:

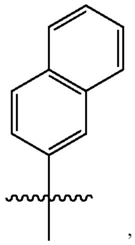
,
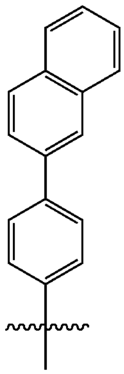
,
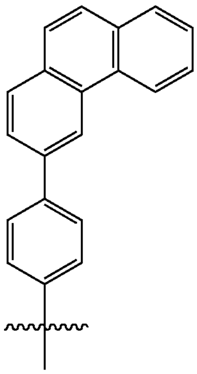
,
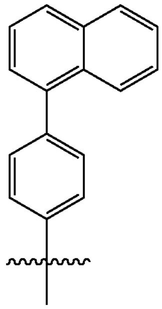
or
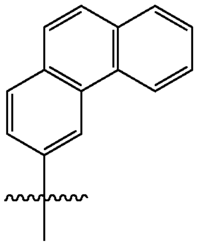
.

In an aspect, in the Chemical Formula 3, each of $L^2$-$R^{12}$ is independently:

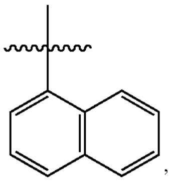
,
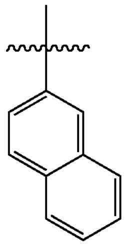
, or
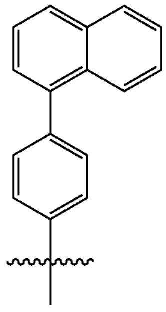
.

The first blue emitting material layer can have a thickness smaller than a thickness of the second blue emitting material layer.

As an example, the first blue emitting material layer can have a thickness of about 20% to about 30% of a thickness of the second blue emitting material layer.

In one embodiment, the second host can have a highest occupied molecular orbital energy level lower than a highest occupied molecular orbital energy level of the first host.

In another embodiment, the second host has a lowest unoccupied molecular orbital energy level lower than a lowest unoccupied molecular orbital energy level of the first host.

Alternatively, the first host can have an excited singlet energy level higher than an excited singlet energy level of the second host.

The emissive layer can further comprise an electron blocking layer disposed between the first electrode and the at least one emitting material layer, and the first host can have a highest occupied molecular orbital energy level higher than a highest occupied molecular orbital energy level of the electron blocking layer.

In one embodiment, the emissive layer can have a single emitting part.

In another embodiment, the emissive layer can comprise a first emitting part disposed between the first electrode and the second electrode; a second emitting part disposed between the first emitting part and the second electrode; a third emitting part disposed between the second emitting part and the second electrode; a first charge generation layer disposed between the first emitting part and the second emitting part; and a second charge generation layer disposed between the second emitting part and the third emitting part, where at least one of the first emitting part, the second emitting part and the third emitting part can comprise the at least one emitting material layer.

In another aspect, the present disclosure provides an organic light emitting diode that comprises a first electrode; a second electrode; and an emissive layer disposed between the first electrode and the second electrode, wherein the emissive layer comprises a first emitting part disposed between the first electrode and the second electrode; a second emitting part disposed between the first emitting part and the second electrode; a third emitting part disposed between the second emitting part and the second electrode; a first charge generation layer disposed between the first emitting part and the second emitting part; and a second charge generation layer disposed between the second emitting part and the third emitting part, wherein the first emitting part comprises a first emitting material layer, wherein the second emitting part comprises a second emitting material layer, wherein the third emitting part comprises a third emitting material layer, wherein each of the first emitting material layer and the third emitting material layer comprises a blue emitting material layer, wherein the blue emitting material layer in the first emitting material layer and the third emitting material layer comprises: a first blue emitting material layer comprising a first host; and a second blue emitting material layer comprising a second host, wherein the first host comprises the organic compound having the structure of Chemical Formula 1, and wherein the second host comprises the organic compound having the structure of Chemical Formula 3.

As an example, the first emitting part can further comprise a first electron blocking layer disposed between the first electrode and the first emitting material layer, the second emitting part can further comprise a second electron blocking layer disposed between the second charge generation layer and the second emitting material layer, the first host in the first blue emitting material layer of the first emitting material layer can have a highest occupied molecular orbital energy level higher than a highest occupied molecular orbital energy level of the first electron blocking layer, and/or the first host in the first blue emitting material layer of the third emitting material layer can have a highest occupied molecular orbital energy level higher than a highest occupied molecular orbital energy level of the second electron blocking layer.

In yet another aspect, the present disclosure provides an organic light emitting device, for example, an organic light emitting display device or an organic light emitting illumination device that includes a substrate and the organic light emitting diode over the substrate.

In one or more embodiments, the first emitting material layer including the first host having a relatively high highest occupied molecular orbital (HOMO) energy level and/or lowest unoccupied molecular orbital (LUMO) energy level is disposed adjacently to a hole transport layer or the electron blocking layer and the second emitting material layer including the second host is disposed adjacently to an electron transport layer.

The exciton recombination zone is generated uniformly within the first blue emitting material layer and the second blue emitting material layer irrespective of current density or gradation changes by disposing two blue emitting material layers.

In one or more embodiments, excitons are not quenched outside of the emitting material layer so that the amount of non-emitting excitons can be minimized. Excitons are not quenched outside of the emitting material layer by quenching mechanism such as triplet-triplet annihilation and/or triplet-polaron annihilation, and thus, the degradation of charge transporting materials by non-emitting excitons can be minimized.

In addition, the first blue emitting material layer including the first host with a relatively high HOMO energy level is disposed adjacently to the electron blocking layer so that holes can be transferred rapidly to the second blue emitting material layer from the first blue emitting material layer. The second blue emitting material layer including the second host with a relatively low HOMO energy level is disposed adjacently to the electron transport layer so that holes are little leaked to the electron transport layer. As the exciton quenching at the interface between the emitting material layer and the electron blocking layer and/or at the interface between the emitting material layer and the electron transport layer is minimized, it is possible to prevent the driving voltage of the diode from being raised.

As the color change by gradation changes is minimized, the high quality colors can be implemented. The organic light emitting diode and the device with low driving voltage as well as low power consumption and improved luminous efficiency can be realized.

It is to be understood that both the foregoing general description and the following detailed description are merely by way of example and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION OF THE EMBODIMENTS

Reference will now be made in detail to aspects of the disclosure, examples of which are illustrated in the accompanying drawings. Wherever possible, the same reference numbers will be used throughout the drawings to refer to the same or like parts. In the following description, when a detailed description of well-known functions or configurations related to this document is determined to unnecessarily cloud a gist of the inventive concept, the detailed description thereof will be or can be omitted. The progression of processing steps and/or operations described is an example; however, the sequence of steps and/or operations is not limited to that set forth herein and can be changed as is known in the art, with the exception of steps and/or operations necessarily occurring in a particular order. Names of the respective elements used in the following explanations are selected only for convenience of writing the specification and can be thus different from those used in actual products. Further, all the components of each organic light emitting diode (OLED) and each organic light emitting device (e.g., display device, illumination device, etc.) using the OLED according to all embodiments of the present disclosure are operatively coupled and configured.

The present disclosure relates to an organic light emitting diode and/or an organic light emitting device that can minimize the color changes by gradation changes, and therefore, can lower driving voltage for the low power consumption and can maximize the luminous properties by plural blue emitting material layers including compounds having a controlled energy level and/or charge mobility.

As an example, in one or more embodiments of the present disclosure, the emissive layer can be applied into an organic light emitting diode with a single emitting part in a blue pixel region. Alternatively, the emissive layer can be applied into an organic light emitting diode where multiple emitting parts are stacked to form a tandem-structure. The organic light emitting diode can be applied to an organic light emitting device such as an organic light emitting display device or an organic light emitting illumination device.

Figure 1:
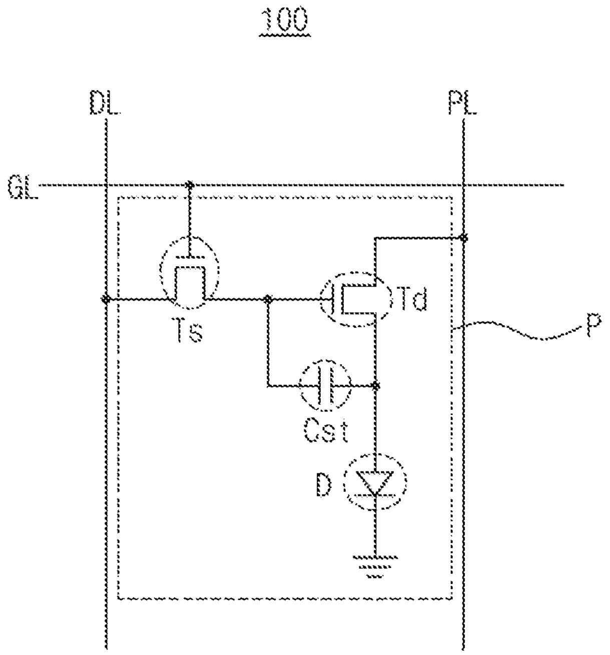
FIG. 1 illustrates a schematic circuit diagram of an organic light emitting display device according to one or more embodiments of the present disclosure.

FIG. 1 illustrates a schematic circuit diagram of an organic light emitting display device in accordance with one or more embodiments of the present disclosure.

As illustrated in FIG. 1, a gate line GL, a data line DL and a power line PL, each of which crosses each other to define a pixel region P, are provided in an organic light emitting display device 100. A switching thin film transistor Ts, a driving thin film transistor Td, a storage capacitor Cst and an organic light emitting diode D are disposed within the pixel region P. The pixel region P can include a red (R) pixel region, a green (G) pixel region and a blue (B) pixel region. However, embodiments of the present disclosure are not limited to such examples. The organic light emitting display device 100 includes a plurality of such pixel regions P which can be arranged in a matrix configuration or other configurations. Further, each pixel region P can include one or more subpixels.

The switching thin film transistor Ts is connected to the gate line GL and the data line DL. The driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied to the gate line GL, a data signal applied to the data line DL is applied to a gate electrode of the driving thin film transistor Td and one electrode of the storage capacitor Cst through the switching thin film transistor Ts.

The driving thin film transistor Td is turned on by the data signal applied to a gate electrode 130 (FIG. 2) so that a current proportional to the data signal is supplied from the power line PL to the organic light emitting diode D through the driving thin film transistor Td. Then, the organic light emitting diode D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

Figure 2:
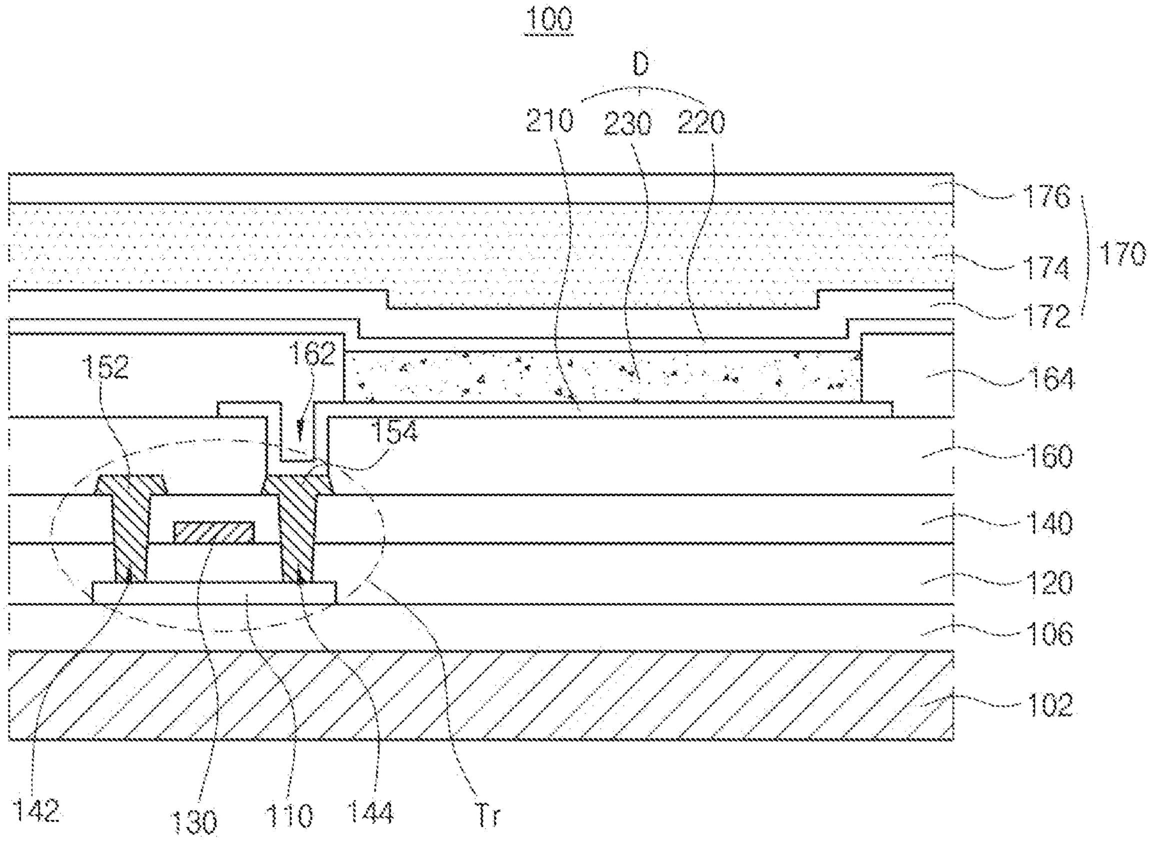
FIG. 2 illustrates a cross-sectional view of an organic light emitting display device as an example of an organic light emitting device in accordance with an example embodiment of the present disclosure.

FIG. 2 illustrates a schematic cross-sectional view of an organic light emitting display device in accordance with an embodiment of the present disclosure. The pixel circuit configuration of FIG. 1 can be used in the display device of FIG. 2 or other figures of the present application.

As illustrated in FIG. 2, the organic light emitting display device 100 includes a substrate 102, a thin-film transistor Tr on the substrate 102, and an organic light emitting diode D connected to the thin film transistor Tr. As an example, the substrate 102 can include a red pixel region, a green pixel region and a blue pixel region and an organic light emitting diode D can be located in each pixel region. Each of the organic light emitting diodes D emitting red, green and blue light, respectively, is located correspondingly in the red pixel region, the green pixel region and the blue pixel region. For example, the organic light emitting diode D can be disposed in the blue pixel region.

The substrate 102 can include, but is not limited to, glass, thin flexible material and/or polymer plastics. For example, the flexible material can be selected from the group, but is not limited to, polyimide (PI), polyethersulfone (PES), polyethylenenaphthalate (PEN), polyethylene terephthalate (PET), polycarbonate (PC) and/or combinations thereof. The substrate 102, on which the thin film transistor Tr and the organic light emitting diode D are arranged, forms an array substrate.

A buffer layer 106 can be disposed on the substrate 102. The thin film transistor Tr can be disposed on the buffer layer 106. In certain embodiments, the buffer layer 106 can be omitted.

A semiconductor layer 110 is disposed on the buffer layer 106. In one embodiment, the semiconductor layer 110 can include, but is not limited to, oxide semiconductor materials. In this case, a light-shield pattern can be disposed under the semiconductor layer 110, and the light-shield pattern can prevent light from being incident toward the semiconductor layer 110, thereby, preventing or reducing the semiconductor layer 110 from being degraded by the light.

Alternatively, the semiconductor layer 110 can include polycrystalline silicon. In this case, opposite edges of the semiconductor layer 110 can be doped with impurities.

A gate insulating layer 120 including an insulating material is disposed on the semiconductor layer 110. The gate insulating layer 120 can include, but is not limited to, an inorganic insulating material such as silicon oxide ($SiO_x$, wherein $0<x\leq2$) or silicon nitride ($SiN_x$, wherein $0<x\leq2$).

A gate electrode 130 made of a conductive material such as a metal is disposed on the gate insulating layer 120 so as to correspond to a center of the semiconductor layer 110. While the gate insulating layer 120 is disposed on the entire area of the substrate 102 as shown in FIG. 2, the gate insulating layer 120 can be patterned identically as the gate electrode 130.

An interlayer insulating layer 140 including an insulating material is disposed on the gate electrode 130 and covers an entire surface of the substrate 102. The interlayer insulating layer 140 can include, but is not limited to, an inorganic insulating material such as silicon oxide ($SiO_x$, wherein $0<x\leq2$) or silicon nitride ($SiN_x$, wherein $0<x\leq2$), or an organic insulating material such as benzocyclobutene or photo-acryl.

The interlayer insulating layer 140 has first and second semiconductor layer contact holes 142 and 144 that expose or do not cover a portion of the surface nearer to the opposing ends than to a center of the semiconductor layer 110. The first and second semiconductor layer contact holes 142 and 144 are disposed on opposite sides of the gate electrode 130 and spaced apart from the gate electrode 130. The first and second semiconductor layer contact holes 142 and 144 are formed within the gate insulating layer 120 and the interlayer insulating layer 140 in FIG. 2. Alternatively, in certain embodiments, the first and second semiconductor layer contact holes 142 and 144 can be formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other on opposing sides of the gate electrode 130, and contact both sides of the semiconductor layer 110 through the first and second semiconductor layer contact holes 142 and 144, respectively. Here, the designation of the source and drain electrodes 152 and 154 can be switched with each other depending on the type and configuration of a transistor.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed on the semiconductor layer 110. Alternatively, the thin film transistor Tr can have an inverted staggered structure in which a gate electrode is disposed under a semiconductor layer and a source and drain electrodes are disposed on the semiconductor layer. In this case, the semiconductor layer can include amorphous silicon.

The gate line GL and the data line DL, which cross each other to define a pixel region P, and a switching element Ts, which is connected to the gate line GL and the data line DL, can be further formed in the pixel region P. The switching element Ts is connected to the thin film transistor Tr, which is a driving element. In addition, the power line PL is spaced apart in parallel from the gate line GL or the data line DL. The thin film transistor Tr can further include a storage capacitor Cst configured to constantly keep a voltage of the gate electrode 130 for one frame.

A passivation layer 160 is disposed on the source and drain electrodes 152 and 154. The passivation layer 160 covers the thin film transistor Tr on the entire substrate 102. The passivation layer 160 has a flat top surface and a drain contact hole (or a contact hole) 162 that exposes or does not cover the drain electrode 154 of the thin film transistor Tr. While the drain contact hole 162 is disposed on the second semiconductor layer contact hole 144, it can be spaced apart from the second semiconductor layer contact hole 144.

The organic light emitting diode (OLED) D includes a first electrode 210 that is disposed on the passivation layer 160 and connected to the drain electrode 154 of the thin film transistor Tr. The OLED D further includes an emissive layer 230 and a second electrode 220 each of which is disposed sequentially on the first electrode 210.

The first electrode 210 is disposed in each pixel region P. The first electrode 210 can be an anode and include a conductive material having a relatively high work function value. For example, the first electrode 210 can include a transparent conductive oxide (TCO).

In one embodiment, when the organic light emitting display device 100 is a bottom-emission type, the first electrode 210 can have a single-layered structure of the TCO. Alternatively, when the organic light emitting display device 100 is a top-emission type, a reflective electrode or a reflective layer can be disposed under the first electrode 210. For example, the reflective electrode or the reflective layer can include, but is not limited to, silver (Ag) or aluminum-palladium-copper (APC) alloy. In the OLED D of the top-emission type, the first electrode 210 can have a triple-layered structure of ITO/Ag/ITO or ITO/APC/ITO.

In addition, a bank layer 164 is disposed on the passivation layer 160 in order to cover edges of the first electrode 210. The bank layer 164 exposes or does not cover a center of the first electrode 210 corresponding to each pixel region. In certain embodiments, the bank layer 164 can be omitted.

Figure 3:
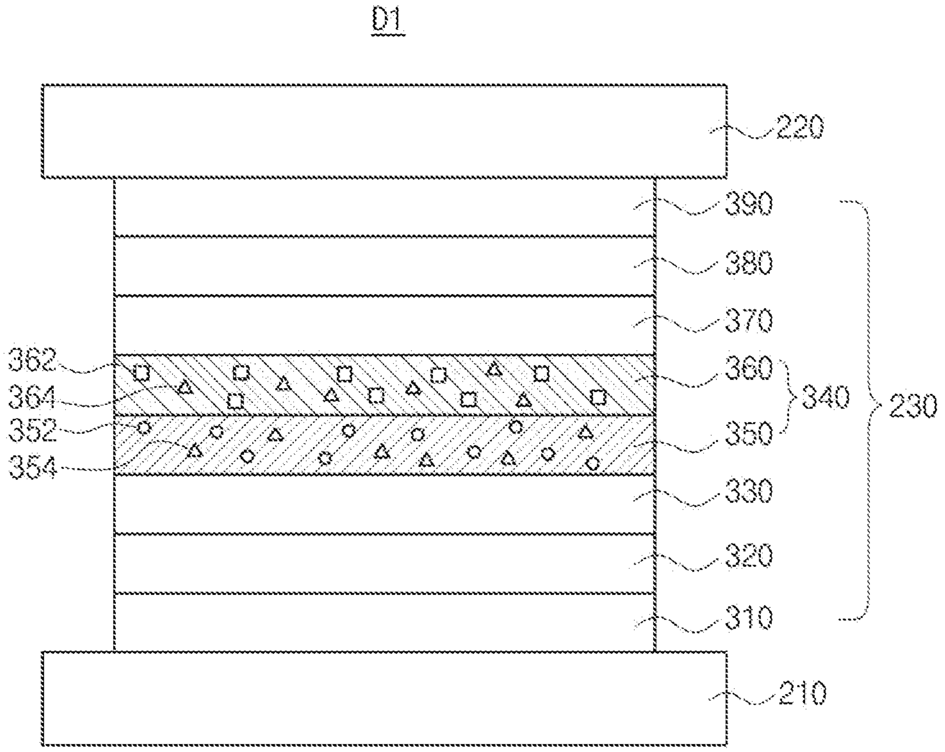
FIG. 3 illustrates a cross-sectional view of an organic light emitting diode having a single emitting part in accordance with an example embodiment of the present disclosure.
Figure 7:
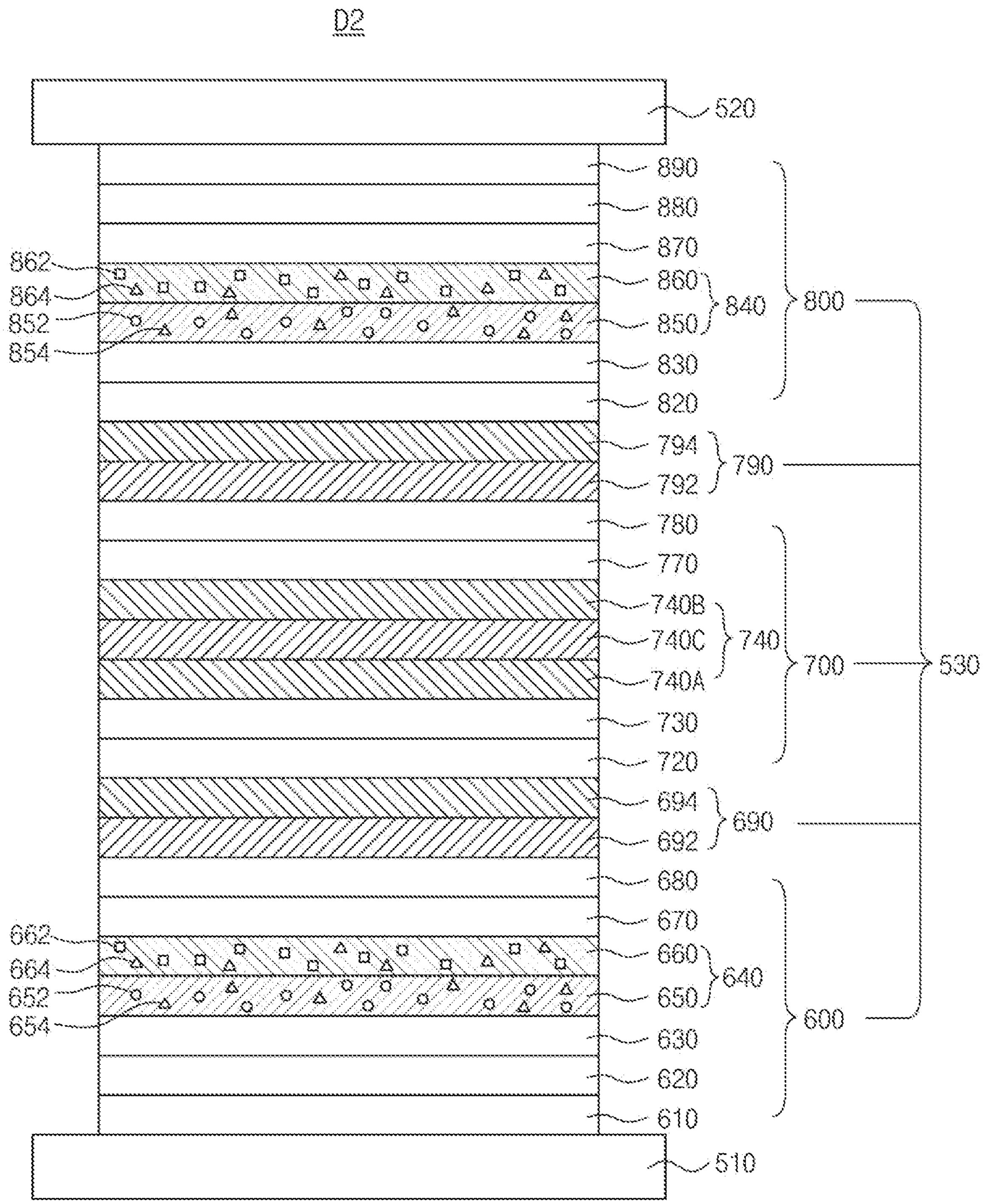
FIG. 7 illustrates a cross-sectional view of an organic light emitting diode having a tandem structure of multiple emitting parts in accordance with another example embodiment of the present disclosure.

The emissive layer 230 is disposed on the first electrode 210. In one embodiment, the emissive layer 230 can have a single-layered structure of an emitting material layer (EML). Alternatively, the emissive layer 230 can have a multiple-layered structure of a hole injection layer (HIL), a hole transport layer (HTL), an electron blocking layer (EBL), an EML, a hole blocking layer (HBL), an electron transport layer (ETL), an electron injection layer (EIL) and/or a charge generation layer (CGL) (FIGS. 3 and 7).

In one aspect, the emissive layer 230 can have a single emitting part. Alternatively, the emissive layer 230 can have multiple emitting parts to form a tandem structure. For example, the emissive layer 230 can be applied to an organic light emitting diode having a single emissive layer disposed in each of the red pixel region, the green pixel region and the blue pixel region, respectively. Alternatively, the emissive layer 230 can be applied to an organic light emitting diode of a tandem structure stacked multiple emitting parts. The emissive layer 230 can comprise plural blue emitting material layers each of which includes a host having a controlled energy level and/or charge mobility.

The second electrode 220 is disposed on the substrate 102 above which the emissive layer 230 is disposed. The second electrode 220 can be disposed on the entire display area. The second electrode 220 can include a conductive material with a relatively low work function value compared to the first electrode 210. The second electrode 220 can be a cathode providing electrons.

In addition, an encapsulation film 170 can be disposed on the second electrode 220 in order to prevent or reduce outer moisture from penetrating into the OLED D. The encapsulation film 170 can have, but is not limited to, a laminated structure of a first inorganic insulating film 172, an organic insulating film 174 and a second inorganic insulating film 176. In certain embodiments, the encapsulation film 170 can be omitted.

A polarizing plate can be attached onto the encapsulation film 170 to reduce reflection of external light. For example, the polarizing plate can be a circular polarizing plate. When the organic light emitting display device 100 is a bottom-emission type, the polarizing plate can be disposed under the substrate 102. Alternatively, when the organic light emitting display device 100 is a top-emission type, the polarizing plate can be disposed on the encapsulation film 170. In addition, a cover window can be attached to the encapsulation film 170 or the polarizing plate. In this case, the substrate 102 and the cover window can have a flexible property, thus the organic light emitting display device 100 can be a flexible display device.

The OLED D is described in more detail. FIG. 3 illustrates a schematic cross-sectional view of an organic light emitting diode having a single emitting part in accordance with an embodiment of the present disclosure. For instance, FIG. 3 shows an example (OLED D1) of the OLED D in FIGS. 1 and 2.

As illustrated in FIG. 3, the organic light emitting diode (OLED) D1 in accordance with an example of the present disclosure includes a first electrode 210, a second electrode 220 facing the first electrode 210 and an emissive layer 230 disposed between the first electrode 210 and the second electrode 220. The organic light emitting display device 100 includes a red pixel region, a green pixel region and a blue pixel region, and the OLED D1 can be disposed in the blue pixel region.

In an embodiment, the emissive layer 230 includes an emitting material layer (EML) 340 disposed between the first and second electrodes 210 and 220. The emissive layer 230 can include at least one of a hole transport layer (HTL) 320 disposed between the first electrode 210 and the EML 340 and an electron transport layer (ETL) 380 disposed between the second electrode 220 and the EML 340. In certain embodiments, the emissive layer 230 can further include at least one of a hole injection layer (HIL) 310 disposed between the first electrode 210 and the HTL 320 and an electron injection layer (EIL) 390 disposed between the second electrode 220 and the ETL 380. Alternatively, the emissive layer 230 can further comprise a first exciton blocking layer, i.e. an electron blocking layer (EBL) 330 disposed between the HTL 320 and the EML 340 and/or a second exciton blocking layer, i.e. a hole blocking layer (HBL) 370 disposed between the EML 340 and the ETL 380. In an alternative embodiment, a second hole transport layer (HTL2) in place of the EBL 330 can be disposed.

The first electrode 210 can be an anode that provides holes into the EML 340. The first electrode 210 can include a conductive material having a relatively high work function value, for example, a transparent conductive oxide (TCO). In an embodiment, the first electrode 210 can include, but is not limited to, indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and/or combinations thereof.

The second electrode 220 can be a cathode that provides electrons into the EML 340. The second electrode 220 can include a conductive material having a relatively low work function value. For example, the second electrode 220 can include a highly reflective material such as aluminum (Al), magnesium (Mg), calcium (Ca), silver (Ag), alloy thereof and/or combinations thereof such as aluminum-magnesium alloy (Al—Mg). When the organic light emitting display device 100 is a top-emission type, the second electrode 220 is thin so as to have light-transmissive (semi-transmissive) property.

The EML 340 comprise a first blue emitting material layer (B-EML1) 350 and a second blue emitting material layer (B-EML2) 360 disposed between the B-EML1 350 and the HBL 370. The B-EML1 350 includes a first host 352 and a first blue emitter (first blue dopant) 354, and the B-EML2 360 includes a second host 362 and a second blue emitter (second blue dopant) 364. Substantial light emission in the B-EML1 350 and the B-EML2 360 is occurred at the first blue emitter 354 and the second blue emitter 364, respectively.

The second host 362 can have a highest occupied molecular orbital (HOMO) energy level lower than a HOMO energy level of the first host 352 and/or can have a lowest unoccupied molecular orbital (LUMO) energy level lower than a LUMO energy level of the first host 352. The B-EML1 350 and the B-EML2 360 each of which includes the first host 352 and the second host 362, respectively, with different energy levels and/or charge mobility can induce the exciton recombination zone to be distributed uniformly within the EML 340, to minimize color changes by the gradation or current density changes, and to improve the luminous properties of the OLED D1.

Figure 4:
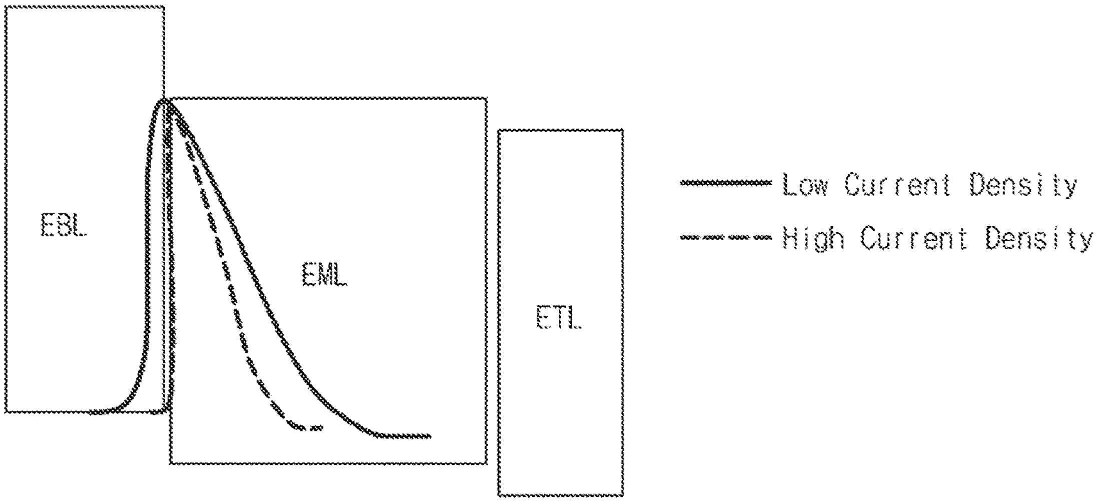
FIG. 4 illustrates a schematic diagram showing exciton recombination zone by current density or gradation changes in a conventional organic light emitting diode where a single blue emitting material layer is applied.

FIG. 4 illustrates a schematic diagram showing exciton recombination zone by current density or gradation changes in a conventional organic light emitting diode where a single blue emitting material layer is applied. An electron transport layer into which electron transporting material with fast electron mobility is applied is used in the conventional blue organic light emitting diode. In this case, a portion of electrons injected into an emitting material layer from the electron transport layer is leaked to an interface between the electron blocking layer (EBL) and the emitting material layer EML. As the exciton recombination zone is concentrated at the interface between the EBL and the EML, the luminous efficiency of the conventional organic light emitting diode is improved by triplet-triplet-fusion (TTF).

On the contrary, the exciton recombination zone, for example, the emission distribution moves gradually to the EBL as time passes, and non-emitting excitons are accumulated at the interface between the EBL and the EML. As the non-emitting quenching excitons degrade the electron blocking materials, the luminous lifespan of the organic light emitting diode is reduced. When the exciton recombination zone, for example, the emission distribution area is biased toward the EBL or the emission distribution becomes narrow, the luminous lifespan of the organic light emitting diode can be reduced as excessive excitons deteriorates the luminous material and/or the electron blocking material.

In particular, in a low current density or low gradation range, even if electrons are injected rapidly into the EML, a portion of the electrons injected into the EML are leaked to the EBL, and thus, non-emitting excitons are generated at the EBL since hole injection is relatively limited. As the current density increases, hole injection becomes faster, the exciton recombination zone moves into the EML and the width of the emitting region becomes narrower, and luminous efficiency of the diode tends to increases due to TTF. The greater the efficiency difference between the low current density and the high current density, the higher the chances of occurrence of color conversion issue in the final emitting device.

In particular, when the emitting distribution region is formed narrowly at the interface between the EBL and the EML, the non-emitting excitons generated at the EBL and the excessively generated excitons accelerates degradation of the electron blocking material. Accordingly, the emission distribution is more biased toward the EBL as time passes, and thus, the luminous efficiency and the luminous lifespan of the organic light emitting diode further decrease.

Figure 5:
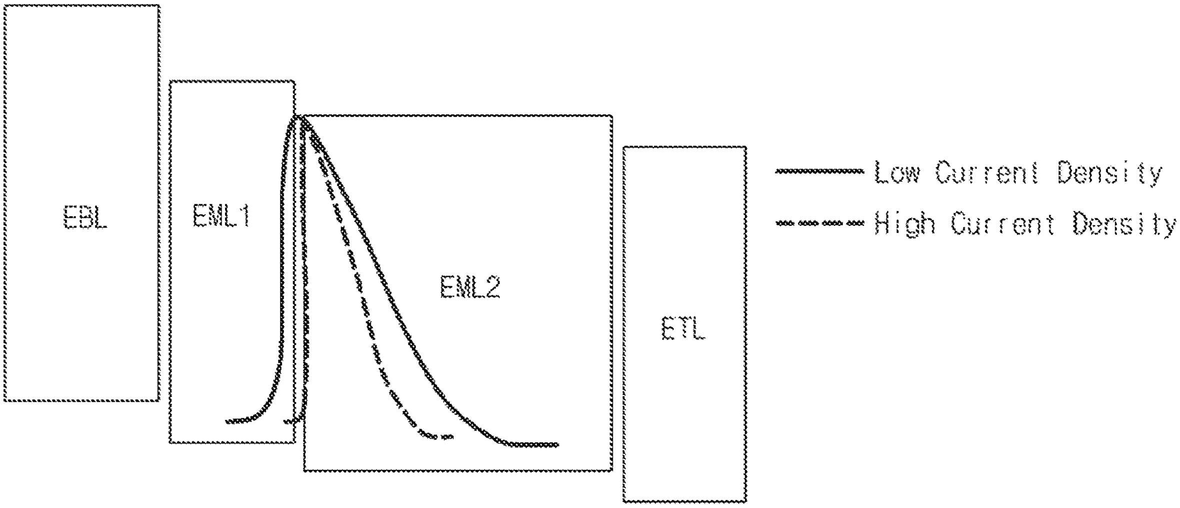
FIG. 5 illustrates a schematic diagram showing exciton recombination zone by current density or gradation changes in an organic light emitting diode with two blue emitting material layers in accordance with an example embodiment of the present disclosure.

FIG. 5 illustrates a schematic diagram showing exciton recombination zone by current density or gradation changes in an organic light emitting diode with two blue emitting material layers in accordance with an example embodiment of the present disclosure.

Referring to FIG. 5, the B-EML1 350 including the first host 352, which has relatively beneficial hole affinity property, has a relatively high (shallow) HOMO energy level compared to the HOMO energy level of the second host 362 in the B-EML2 360, and being relatively thin, is disposed between the HTL 320 or the EBL 330 and the B-EML2 360.

Two blue emitting material layers B-EML1 and B-EML2 disposed between the EBL 330 and the ETL 380 can induce the exciton recombination zone or the emitting area, to be formed within the entire EML 340 including the B-EML1 350 and the B-EML2 360 in both the low current density and the high current density. As the amount of non-emission excitons leaked outside of the EML 340 decreases, it is possible to minimize the color sense among the low current density and the high current density.

As the first host 352 with relatively excellent hole affinity properties is applied into the B-EML1 350 disposed adjacently to the HTL 320, holes can be transferred rapidly to the B-EML2 360, and thus, holes and electrons can be recombined to generate excitons within the EML 340. The driving voltage of the OLED D1 can be lowered by preventing deterioration of the luminous material caused by the non-emitting quenching of the excessively injected electrons in comparison to holes.

As the excitons are not quenched to the outside of the EML 340, non-emitting excitons can be minimized. In other words, the excitons are not quenched as non-emission by triplet-triplet-annihilation (TTA) and/or triplet-polaron-annihilation (TPA). As the exciton recombination zone is formed through the B-EML1 350 to the B-EML2 360, the degradation of the material in the EBL 330 owing to the excess electrons that are quenched by non-emission is minimized.

In addition, the B-EML1 350 having the first host 352 with a relatively high HOMO energy level is disposed adjacently to the EBL 330 and/or the HTL 320, the B-EML2 360 having the second host 362 with a relatively low HOMO energy level is disposed adjacently to the ETL 380. Holes injected into the EML 340 from the EBL 330 are rapidly transferred to the B-EML2 360 from the B-EML1 350, and thus, the luminous efficiency of the OLED D1 can be further improved.

The B-EML2 360 with a relatively low HOMO energy level prevents holes from being leaked into the ETL 380. It is possible to prevent the driving voltage of the OLED D1 from being raised by minimizing exciton quenching at the interface between the EML 340 and the ETL 380.

Although the emitting distribution moves toward the B-EML1 350 as time passes, the excitons can be generated in the B-EML1 350. As the stress of the materials in the EBL 330 and the EML 340, which is known as a major material degradation mechanism in the conventional organic light emitting diode, decreases, luminous efficiency and the luminous lifetime of the OLED D1 can be further improved.

The first host 352 with relatively beneficial hole mobility and/or hole affinity properties can comprise a pyrene-based organic compound. For example, the first host 352 comprise an organic compound having the following structure of Chemical Formula 1:

[Chemical Formula 1]

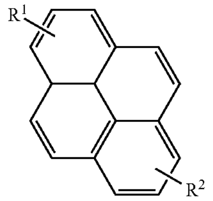

wherein, in the Chemical Formula 1, each of $R^1$ and $R^2$ is independently hydrogen, an unsubstituted or substituted $C_1$-$C_{20}$ alkyl group, an unsubstituted or substituted $C_6$-$C_{30}$ aryl group or an unsubstituted or substituted $C_3$-$C_{30}$ hetero aryl group.

As used herein, the term "unsubstituted" means that hydrogen is directly linked to a carbon atom. "Hydrogen", as used herein, can refer to protium, deuterium and tritium.

As used herein, "substituted" means that the hydrogen is replaced with a substituent. The substituent can comprise, but is not limited to, an unsubstituted or halogen-substituted $C_1$-$C_{20}$ alkyl group, an unsubstituted or halogen-substituted $C_1$-$C_{20}$ alkoxy, halogen, a cyano group, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a nitro group, a hydrazyl group, a sulfonate group, a $C_1$-$C_{10}$ alkyl silyl group, a $C_1$-$C_{10}$ alkoxy silyl group, a $C_3$-$C_{20}$ cyclo alkyl silyl group, a $C_6$-$C_{30}$ aryl silyl group, a $C_3$-$C_{30}$ hetero aryl silyl group, an unsubstituted or substituted $C_6$-$C_{30}$ aryl group, an unsubstituted or substituted $C_3$-$C_{30}$ hetero aryl group.

As used herein, the term "hetero" in terms such as "a hetero aryl group", and "a hetero arylene group" and the likes means that at least one carbon atom, for example 1 to 5 carbons atoms, constituting an aliphatic chain, an alicyclic group or ring or an aromatic group or ring is substituted with at least one hetero atom selected from the group consisting of N, O, S and P.

The aryl group can independently include, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl or spiro-fluorenyl.

The hetero aryl group can independently include, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthalazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thiazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, dihydroacridinyl substituted with at least one $C_1$-$C_{10}$ alkyl and N-substituted spiro fluorenyl.

As an example, each of the aryl group or the hetero aryl group can consist of one to four, for example, one to three, aromatic and/or hetero aromatic rings. When the number of the aromatic and/or hetero aromatic rings of the aryl group and/or the hetero aryl group becomes more than four, conjugated structure within the whole molecule becomes too long, thus, the organic compound can have too narrow energy bandgap. For example, each of the aryl group or the hetero aryl group can comprise independently, but is not limited to, phenyl, biphenyl, naphthyl, anthracenyl, pyrrolyl, triazinyl, imidazolyl, pyrazolyl, pyridinyl, pyrazinyl, pyrimidinyl, pyridazinyl, furanyl, benzo-furanyl, dibenzo-furanyl, thiophenyl, benzo-thiophenyl, dibenzo-thiophenyl, carbazolyl, acridinyl, carbolinyl, phenazinyl, phenoxazinyl, or phenothiazinyl.

For example, each of the $C_6$-$C_{30}$ aryl group and the $C_3$-$C_{30}$ hetero aryl group of $R^1$ and $R^2$ in Chemical Formula 1 can be independently unsubstituted or substituted with at least one group of $C_1$-$C_{10}$ alkyl, $C_6$-$C_{20}$ aryl or $C_3$-$C_{20}$ hetero aryl. In one embodiment, at least one of $R^1$ and $R^2$ in Chemical Formula 1 can be independently a poly-cyclic aryl group or a poly-cyclic hetero aryl group. As an example, $R^1$ in Chemical Formula 1 can be hydrogen, or phenyl, naphthyl, phenanthrenyl, dibenzofuranyl or dibenzothiophenyl unsubstituted or substituted with another $C_6$-$C_{20}$ aryl group (e.g., phenyl, naphthyl and/or pyrenyl), and $R^2$ in Chemical Formula 1 can be hydrogen, or dibenzofuranyl, fluorenyl, benzo-naphthofurnaly or phenanthrenyl unsubstituted or substituted with another $C_1$-$C_{20}$ alkyl group (e.g., methyl) and/or a $C_6$-$C_{20}$ aryl group (e.g., phenyl and/or pyrenyl).

The first host 352 can have a HOMO energy level and/or a LUMO energy level higher than a HOMO energy level and/or a LUMO energy level of the second host 362. In one embodiment, the first host 352 can have a HOMO energy level between about −5.6 eV and −5.9 eV, for example, about −5.7 eV and about −5.85 eV, and a LUMO energy level between about −2.6 eV and about −2.9 eV, for example, about −2.6 eV and about −2.8 eV, but is not limited thereto.

More particularly, the first host 352 can be, but is not limited to, at least one of the following compounds of Chemical Formula 2:

[Chemical Formula 2]

BH1-1

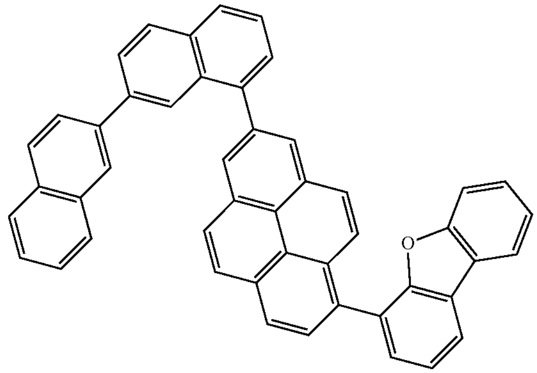

BH1-2

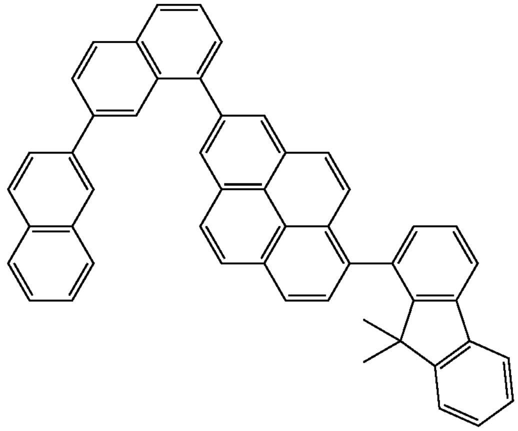

BH1-3

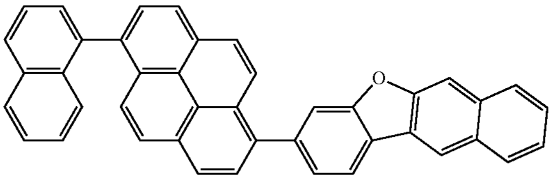

-continued

BH1-4

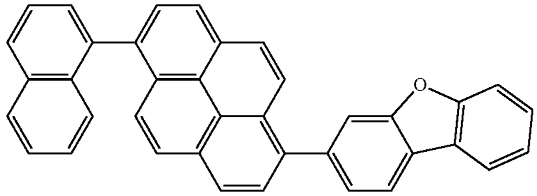

BH1-5

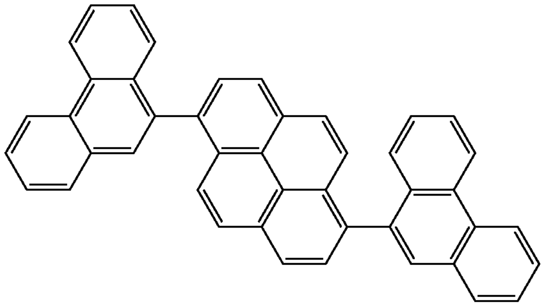

BH1-6

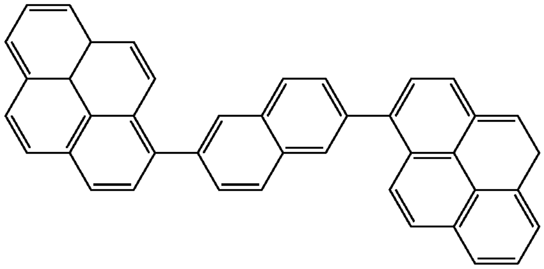

BH1-7

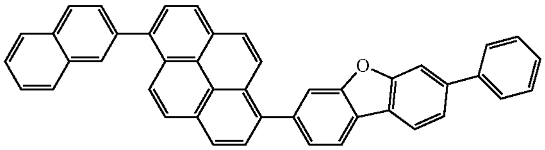

BH1-8

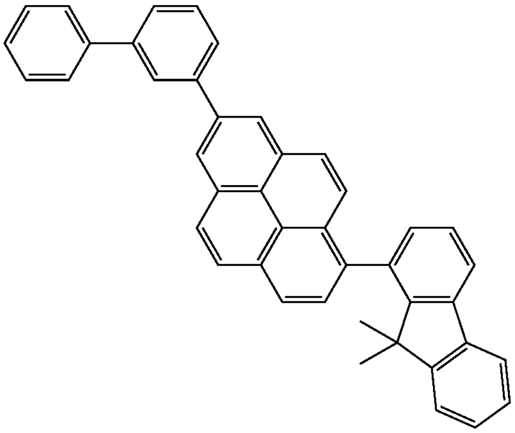

-continued

BH1-9

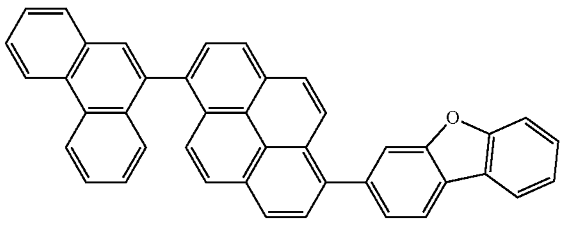

BH1-10

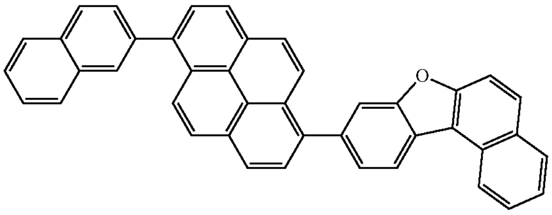

BH1-11

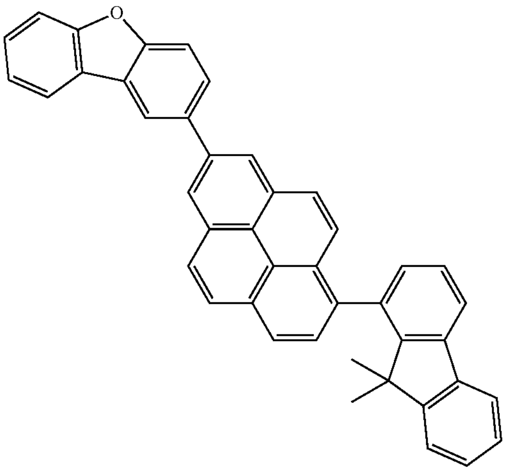

BH1-12

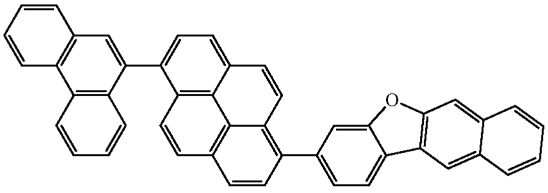

The second host 362 can be an anthracene-based organic compound. As an example, the second host 362 can comprise an organic compound having the following structure of Chemical Formula 3:

[Chemical Formula 3]

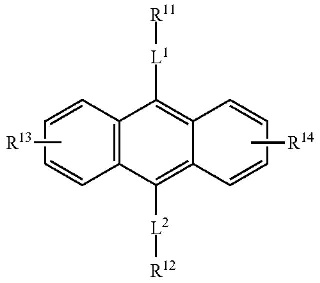

wherein, in the Chemical Formula 3, each of $R^{11}$ and $R^{12}$ is independently an unsubstituted or substituted $C_6$-$C_{30}$ aryl group or an unsubstituted or substituted $C_3$-$C_{30}$ hetero aryl group, each of $R^{13}$ and $R^{14}$ is independently hydrogen, an unsubstituted or substituted $C_1$-$C_{20}$ alkyl group, an unsubstituted or substituted $C_6$-$C_{30}$ aryl group or an unsubstituted or substituted $C_3$-$C_{30}$ hetero aryl group; and each of $L^1$ and $L^2$ is independently a single bond, an unsubstituted or substituted $C_6$-$C_{30}$ arylene group or an unsubstituted or substituted $C_3$-$C_{30}$ hetero arylene group.

For example, each of the $C_1$-$C_{20}$ alkyl group, the $C_6$-$C_{30}$ aryl group and the $C_3$-$C_{30}$ hetero aryl group of $R^{11}$ to $R^{14}$ in Chemical Formula 2 can be independently unsubstituted or substituted with at least one group of $C_1$-$C_{10}$ alkyl, $C_6$-$C_{20}$ aryl or $C_3$-$C_{20}$ hetero aryl. In one embodiment, the second host 362 can have a HOMO energy level between about −5.8 eV and −6.3 eV, for example, about −5.9 eV and about −6.2 eV, and a LUMO energy level between about −2.8 eV and about −3.3 eV, for example, about −2.8 eV and about −3.2 eV, but is not limited thereto.

In one embodiment, the second host 362 can comprise, but is not limited to, 9,10-di(naphthalen-2-yl)anthracene (ADN), 2-methyl-9,10-bis(naphthalen-2-yl)anthracene (MADN), 2-tert-Butyl-9,10-di(naphthen-2-yl)anthracene (TBADN), 9,10-di(naphthalen-2-yl)-2-phenylanthracene (PADN), 9,10-di(1-naphthyl)anthracene, 9-(naphthalene-1-yl)-10-(naphthalene-2-yl)anthracene, 9-(2-napthyl)-10-[4-(1-naphthyl)phenyl]anthracene, 9-(1-napthyl)-10-[4-(2-naphthyl)phenyl]anthracene, 9-phenyl-10-(p-tolyl) anthracene (PTA), 9-(1-naphthyl)-10-(p-tolyl)anthracene (1-NTA), 9-(2-naphthyl)-10-(p-tolyl)anthracene (2-NTA), 2-(3-(10-phenylanthracen-9-yl)-phenyl)dibenzo[b,d]furan (m-PPDF), 2-(4-(10-phenylanthracen-9-yl)phenyl)dibenzo [b,d]furan (p-PPDF) and/or combinations thereof.

In another embodiment, the second host 362 can be, but is not limited to, at least one of the following compounds of Chemical Formula 4:

[Chemical Formula 4]
BH2-1
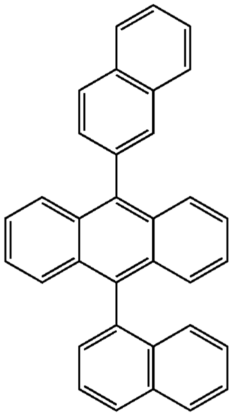
BH2-2
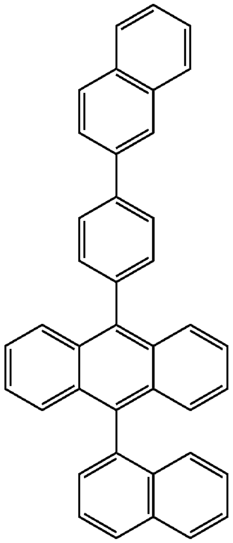
BH2-3
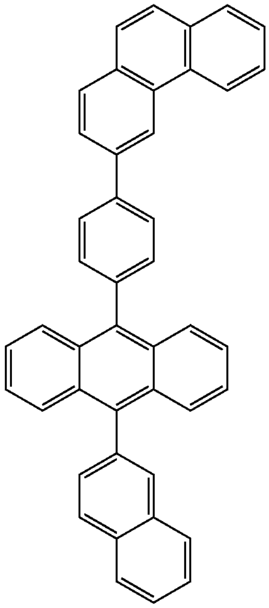
-continued
BH2-4
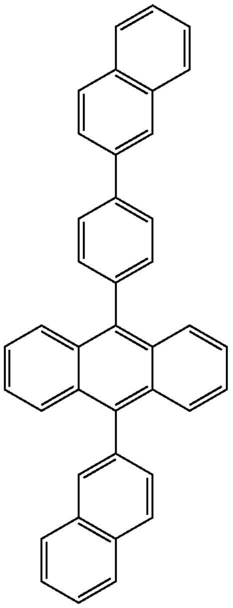
BH2-5
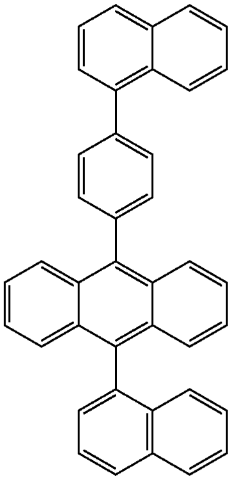
BH2-6
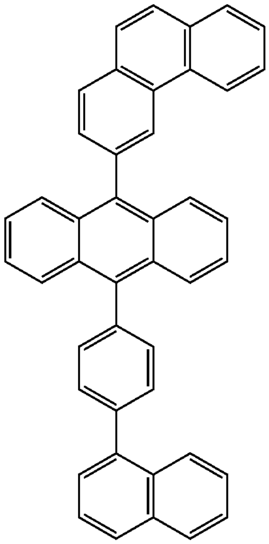

-continued

BH2-7

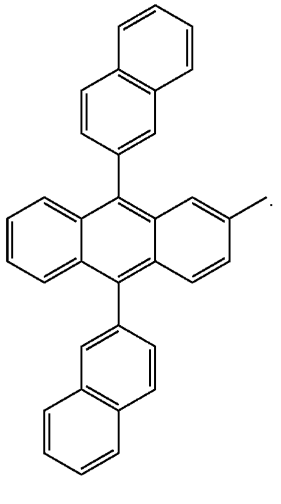

Each of the first blue emitter 354 and the second blue emitter 364 can independently include at least one of blue phosphorescent material, blue fluorescent material and blue delayed fluorescent material, for example, blue fluorescent material. The first blue emitter 354 can be identical to or different from the second blue emitter 364.

For example, each of the first blue emitter 354 and the second blue emitter 364 can independently include, but is not limited to, perylene, 4,4'-Bis[4-(di-p-tolylamino)styryl] biphenyl (DPAVBi), 4-(Di-p-tolylamino)-4-4'-[(di-p-tolylamino)styryl]stilbene (DPAVB), 4,4'-Bis[4-(diphenylamino)styryl]biphenyl (BDAVBi), 2,7-Bis(4-diphenylamino)styryl)-9,9-spirofluorene (spiro-DPVBi), [1,4-bis[2-[4-[N,N-di(p-tolyl)amino]phenyl]vinyl]benzene (DSB), 1-4-di-[4-(N,N-diphenyl)amino]styryl-benzene (DSA), 2,5,8,11-Tetra-tetr-butylperylene (TBPe), Bis((2-hydroxylphenyl)-pyridine)beryllium ($Bepp_2$), 9-(9-Phenylcarbazol-3-yl)-10-(naphthalen-1-yl)anthracene (PCAN), mer-Tris(1-phenyl-3-methylimidazolin-2-ylidene-C,C(2))'iridium(III) (mer-$Ir(pmi)_3$), fac-Tris(1,3-diphenyl-benzimidazolin-2-ylidene-C,C(2))'iridium(III) (fac-Ir $(dpbic)_3$), Bis(3,4,5-trifluoro-2-(2-pyridyl)phenyl-(2-carboxypyridyl))iridium(III) ($Ir(tfpd)_2pic$), tris(2-(4,6-difluorophenyl)pyridine)iridium(III) ($Ir(Fppy)_3$), Bis[2-(4,6-difluorophenyl)pyridinato-$C^2$,N](picolinato)iridium(III) (FIrpic), DABNA-1, DABNA-2, t-DABNA, v-DABNA and/or combinations thereof.

The contents of the first host 352 in the B-EML1 350 and the second host 362 in the B-EML2 360 can be about 50 wt % to about 99 wt %, for example, about 80 wt/o to about 95 wt %, and the contents of the first blue emitter 354 in the B-EML1 350 and the second blue emitter 364 in the B-EML2 360 can be about 1 wt % to about 50 wt %, for example, about 5 wt % to about 20 wt %, but is not limited thereto.

In another embodiment, the first host 352 can have an excited singlet energy level higher than an excited singlet energy level of the second host 362. The second host 362 can have an excited singlet energy level higher than the excited singlet energy levels of the first blue emitter 354 and the second blue emitter 364. As an example, the first host 352 can have an excited singlet energy level between about 2.6 eV and about 3.0 eV, for example, about 2.8 eV and about 3.0 eV, the second host 362 can have an excited singlet energy level between about 2.6 eV and about 2.8 eV, for example, about 2.6 eV to less than about 2.8 eV, but is not limited thereto.

In one embodiment, the energy bandgap between the HOMO energy level of the first host 352 and the HOMO energy level of the EBL 330 can be, but is not limited to, equal to or less than about 0.2 eV. In another embodiment, the HOMO energy level of the first host 352 can be higher than the HOMO energy level of the EBL 330 (e.g., about 0.05 eV to about 0.2 eV), but is not limited thereto.

In another embodiment, each of the first blue emitter 354 and the second blue emitter 364 can have an excited triplet energy level higher than an excited triplet energy level of the first host 352. The first host 352 can have an excited triplet energy level higher than an excited triplet energy level of the second host 362. As an example, the first host 352 can have an excited triplet energy level between about 1.8 eV to about 2.2 eV, for example, about 1.8 eV and about 2.0 eV, and the second host 362 can have an excited triplet energy level between about 1.6 eV and about 1.9 eV, for example, about 1.6 eV and about 1.7 eV, but is not limited thereto.

In further another embodiment, the B-EML1 350 including the first host 352 of the pyrene-based compound can have a thickness smaller than a thickness of the B-EML2 360 including the second host 362 of the anthracene-based compound. As an example, the B-EML1 350 can have a thickness of about 20% to about 30% of the thickness of the B-EML2 360.

When the thickness of the B-EML1 350 is more than about 30% of the thickness of the B-EML2 360, the color purity and/or the efficiency of the EML 340 can be reduced owing the first host 352 that has a maximum photoluminescence peak in a relative longer wavelength compared to the second host 362. When the thickness of the B-EML1 35 is less than about 20% of the thickness of the B-EML2 360, exciton recombination zone can be formed in the EBL 330, and thus, it can be difficult to prevent color changes by the gradation changes and/or to improve the luminous efficiency and the luminous lifespan.

Returning to FIG. 3, the HIL 310 is disposed between the first electrode 210 and the HTL 320 and can improve an interface property between the inorganic first electrode 210 and the organic HTL 320. In one embodiment, hole injecting material in the HIL 310 can include, but is not limited to, 4,4',4"-Tris(3-methylphenylamino)triphenylamine (MT-DATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), N,N'-Bis{4-[bis(3-methylphenyl)amino]phenyl}-N,N'-diphenyl-4,4'-biphenyldiamine (DNTPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 2,3,5,6-Tetrafluoro-7,7,8,8-tetracyano-quinodimethane (F4-TCNQ), 1,3,4,5,7,8-hexafluoro-tetracyano-naphthoquinodimethane (F6-TCNNQ), 1,3,5-tris [4-(diphenylamino)phenyl]benzene (TDAPB), poly(3,4-ethylenedioxythiophene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine, N,N'-diphenyl-N,N'-di[4-(N,N'-diphenyl-amino)phenyl]benzidine (NPNPB), Di-[4-(N,N-di-p-toylyl-amino)-phenyl]cyclohexane (TAPC), N4,N4,N4',N4'-Tetra[(1,1'-biphenyl)-4-yl]-(1,1'-biphenyl)-4,4'-diamine (BPBPA), $MgF_2$, $CaF_2$ and/or combinations thereof.

In another embodiment, the HIL 310 can include a hole transporting material described below doped with the above hole injecting material (e.g., organic material such as HAT-CN, F4-TCNA and/or F6-TCNNQ and/or inorganic material such as $MgF_2$ and/or $CaF_2$). In this case, the contents of the hole injecting material in the HIL 310 can be, but is not limited to, about 1 wt % to about 50 wt %, for example, about 5 wt % to about 50 wt %. In certain embodiments, the HIL 310 can be omitted in compliance of the OLED D1 property.

The HTL 320 is disposed between the first electrode 210 and the EML 340. In one embodiment, the hole transporting material in the HTL 320 can include, but is not limited to, N,N'-Diphenyl-N,N'-bis(3-methylphenyl)-1,1'-biphenyl-4,4'-diamine (TPD), NPB(NPD), 4,4'-bis(N-carbazolyl)-1,1'-biphenyl (CBP), DNTPD, BPBPA, NPNPB, Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), TAPC, 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine and/or combinations thereof.

The ETL 380 and the EIL 390 can be laminated sequentially between the EML 340 and the second electrode 220. An electron transporting material included in the ETL 380 has high electron mobility so as to provide electrons stably with the EML 340 by fast electron transportation.

In one embodiment, the electron transporting material in the ETL 380 can include at least one of an oxadiazole-based compound, a triazole-based compound, a phenanthroline-based compound, a benzoxazole-based compound, a benzothiazole-based compound, a benzimidazole-based compound, and a triazine-based compound.

For example, the electron transporting material in the ETL 380 can include, but is not limited to, tris-(8-hydroxy-quinoline) aluminum ($Alq_3$), 2-biphenyl-4-yl-5-(4-t-butylphenyl)-1,3,4-oxadiazole (PBD), spiro-PBD, lithium quinolate (Liq), 2,2', 2"-(1,3,5-benzenetriyl)-tris(1-phenyl-1-H-benzimidazole) (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenanthroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)] dibromide (PFNBr), tris(phenylquinoxaline) (TPQ), TSPO1, 2-[4-(9,10-Di-2-naphthalen2-yl-2-anthracen-2-yl)phenyl]-1-phenyl-1H-benzimidazole (ZADN), the following electron transporting material in Chemical Formula 5 and/or combinations thereof.

[Chemical Formula 5]

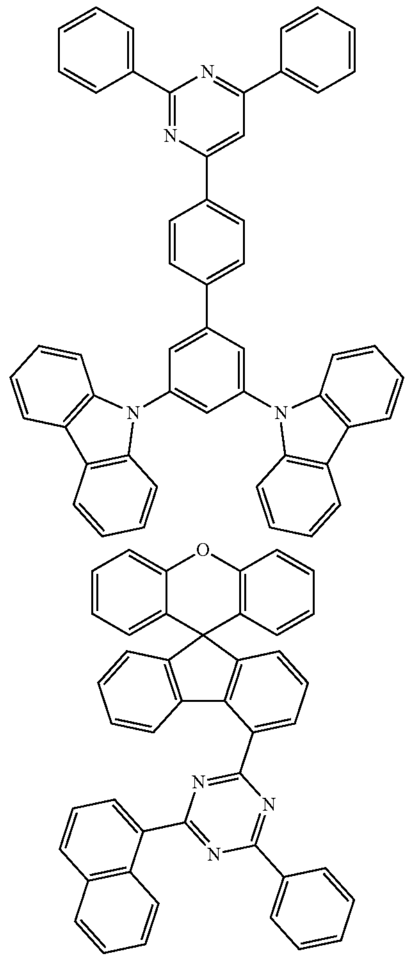

The EIL 390 is disposed between the second electrode 220 and the ETL 380, and can improve physical properties of the second electrode 220 and therefore, can enhance the lifespan of the OLED D1. In one embodiment, electron injecting material in the EIL 390 can include, but is not limited to, an alkali metal halide and/or an alkaline earth metal halide such as LiF, CsF, NaF, $BaF_2$ and the like, and/or an organometallic compound such as Liq, lithium benzoate, sodium stearate, and the like.

In an alternative embodiment, the ETL 380 and the EIL 390 can have a single layered structure. In this case, the above electron transporting material and/or the electron injecting material can be mixed with each other. As an example, the ETL/EIL can include two or more different electron transporting materials. For example, two electron transporting materials in the ETL/EIL are admixed with a weight ratio of about 3:7 to about 7:3, but is not limited thereto.

When holes are transferred to the second electrode 220 via the EML 340, the OLED D1 can have a short lifespan and a reduced luminous efficiency. In order to prevent or address those phenomena, the OLED D1 in accordance with this aspect of the present disclosure can further include at least one exciton blocking layer disposed adjacently to the EML 340. For example, the OLED D1 in accordance with this aspect of the present disclosure can further include the EBL 330 between the HTL 320 and the EML 340 so as to control and prevent electron transportation.

As an example, electron blocking material in the EBL 330 can include, but is not limited to, TCTA, N-(biphenyl-4-yl)-9,9-dimethyl-N-(4-(9-phenyl-9H-carbazol-3-yl)phenyl)-9H-fluoren-2-amine, TAPC, MTDATA, 1,3-Bis(carbazol-9-yl)benzene (mCP), 3,3-Di(9H-carbazol-9-yl)biphenyl (mCBP), CuPc, DNTPD, TDABP, DCDPA, 2,8-bis(9-phenyl-9H-carbazol-3-yl)dibenzo[b,d]thiophene and/or combinations thereof.

In addition, the OLED D1 in accordance with this aspect of the present disclosure can further include the HBL 370 between the EML 340 and the ETL 380 so that holes cannot be transferred from the EML 340 to the ETL 380. In one embodiment, hole blocking material in the HBL 370 can include, but is not limited to, at least one of an oxadiazole-based compound, a triazole-based compound, a phenanthroline-based compound, a benzoxazole-based compound, a benzothiazole-based compound, a benzimidazole-based compound, and a triazine-based compound.

For example, a hole blocking material in the HBL 370 can include a material having a relatively low HOMO energy level compared to the luminescent materials in EML 340. The HBL 370 can include, but is not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole, TSPO1 and/or combinations thereof. In certain embodiments, each of the EBL 330 and/or the HBL 370 can be omitted.

The OLED D1 comprises two blue emitting material layers 350 and 360 each of which includes the first host 352 and the second host 362, respectively, having a controlled energy level and/or charge mobility. Exciton recombination zone is formed with the EML 340 irrespective of current density changes. As exciton quenching is prevented, it is possible to suppress the driving voltage rising of the OLED D1 and to secure the beneficial luminous efficiency and luminous lifespan.

An organic light emitting display device and an organic light emitting diode with a single emitting part emitting blue color light are described in the above embodiments. In another embodiment, an organic light emitting display device can implement full-color including white color. As an example, FIG. 6 illustrates a schematic cross-sectional view of an organic light emitting display device in accordance with another embodiment of the present disclosure.

Figure 6:
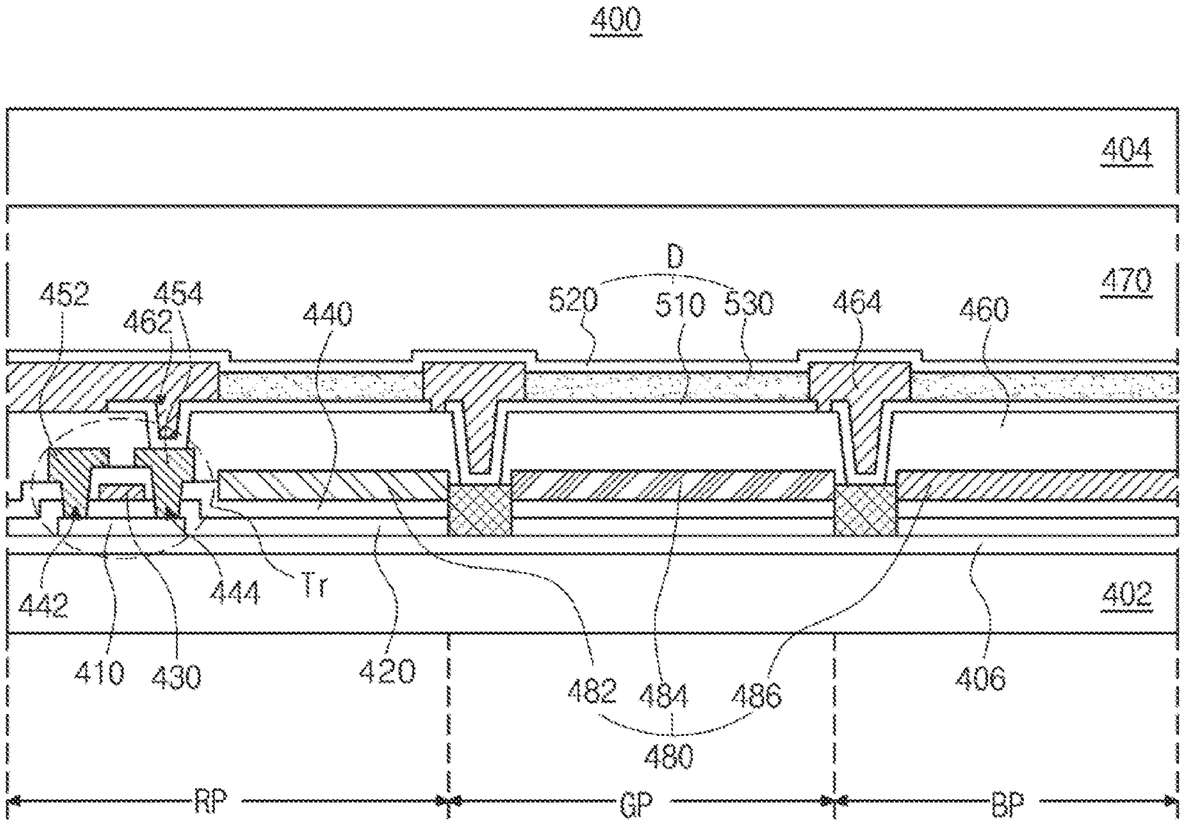
FIG. 6 illustrates a cross-sectional view of an organic light emitting display device in accordance with another example embodiment of the present disclosure.

As illustrated in FIG. 6, an organic light emitting display device 400 comprises a first substrate 402 that defines each of a red pixel region RP, a green pixel region GP and a blue pixel region BP, a second substrate 404 facing the first substrate 402, a thin film transistor Tr on the first substrate 402, an organic light emitting diode (OLED) D disposed between the first and second substrates 402 and 404 and emitting white (W) light and a color filter layer 480 disposed between the OLED D and the first substrate 402. The organic light emitting display device 400 can include a plurality of such pixel regions arranged in a matrix configuration or other suitable configurations.

Each of the first substrate 402 and the second substrate 404 can include, but is not limited to, glass, flexible material and/or polymer plastics. For example, each of the first and second substrates 402 and 404 can be made of PI, PES, PEN, PET, PC and/or combinations thereof. The first substrate 402, on which a thin film transistor Tr and the OLED D are arranged, forms an array substrate. In certain embodiments, the second substrate 404 can be omitted.

A buffer layer 406 can be disposed on the first substrate 402. The thin film transistor Tr is disposed on the buffer layer 406 correspondingly to each of the red pixel region RP, the green pixel region GP and the blue pixel region BP. In certain embodiments, the buffer layer 406 can be omitted.

A semiconductor layer 410 is disposed on the buffer layer 406. The semiconductor layer 410 can be made of or include oxide a semiconductor material or polycrystalline silicon.

A gate insulating layer 420 including an insulating material, for example, an inorganic insulating material such as silicon oxide ($SiO_x$, wherein $0<x\leq2$) or silicon nitride ($SiN_x$, wherein $0<x\leq2$) is disposed on the semiconductor layer 410.

A gate electrode 430 made of a conductive material such as a metal is disposed on the gate insulating layer 420 so as to correspond to a center or middle area of the semiconductor layer 410. An interlayer insulating layer 440 including an insulating material, for example, an inorganic insulating material such as $SiO_x$ or $SiN_x$, (wherein $0<x\leq2$) or an organic insulating material such as benzocyclobutene or photo-acryl, is disposed on the gate electrode 430.

The interlayer insulating layer 440 has first and second semiconductor layer contact holes 442 and 444 that expose or do not cover a portion of the surface nearer to the opposing ends than to a center of the semiconductor layer 410. The first and second semiconductor layer contact holes 442 and 444 are disposed on opposite sides of the gate electrode 430 with spacing apart from the gate electrode 430.

A source electrode 452 and a drain electrode 454, which are made of or include a conductive material such as a metal, are disposed on the interlayer insulating layer 440. The source electrode 452 and the drain electrode 454 are spaced apart from each other with respect to the gate electrode 430. The source electrode 452 and the drain electrode 454 contact both sides of the semiconductor layer 410 through the first and second semiconductor layer contact holes 442 and 444, respectively. The source and drain electrodes 452 and 454 can be switched with each other depending on the types of transistors and display structure used.

The semiconductor layer 410, the gate electrode 430, the source electrode 452 and the drain electrode 454 constitute the thin film transistor Tr, which acts as a driving element.

In some aspects, as shown in FIG. 1, the gate line GL and the data line DL, which cross each other to define the pixel region P, and a switching element Ts, which is connected to the gate line GL and the data line DL, can be further formed in the pixel region P. The switching element Ts is connected to the thin film transistor Tr, which is a driving element. In addition, the power line PL is spaced apart in parallel from the gate line GL or the data line DL, and the thin film transistor Tr can further include the storage capacitor Cst configured to constantly keep a voltage of the gate electrode 430 for one frame.

A passivation layer 460 is disposed on the source electrode 452 and the drain electrode 454 and covers the thin film transistor Tr over the whole first substrate 402. The passivation layer 460 has a drain contact hole 462 that exposes or does not cover the drain electrode 454 of the thin film transistor Tr.

The OLED D is located on the passivation layer 460. The OLED D includes a first electrode 510 that is connected to the drain electrode 454 of the thin film transistor Tr, a second electrode 520 facing the first electrode 510 and an emissive layer 530 disposed between the first and second electrodes 510 and 520.

The first electrode 510 formed for each pixel region RP, GP or BP can be an anode and can include a conductive material having a relatively high work function value. For example, the first electrode 510 can include, but is not limited to, ITO, IZO, ITZO, SnO, ZnO, ICO, AZO, and/or combinations thereof.

A bank layer 464 is disposed on the passivation layer 460 in order to cover edges of the first electrode 510. The bank layer 464 exposes or does not cover a center of the first electrode 510 corresponding to each of the red pixel region RP, the green pixel region GP and the blue pixel region BP. In certain embodiments, the bank layer 464 can be omitted.

An emissive layer 530 that can include multiple emitting parts is disposed on the first electrode 510. As illustrated in FIG. 7 as one example, the emissive layer 530 can include multiple emitting parts 600, 700 and 800, and at least one charge generation layer 690 and 790. Each of the emitting parts 600, 700 and 800 includes at least one emitting material layer and can further include an HIL, an HTL, an EBL, an HBL, an ETL and/or an EIL. FIG. 7 will be discussed in more detail later.

Referring back to FIG. 6, the second electrode 520 can be disposed on the first substrate 402 above which the emissive layer 530 can be disposed. The second electrode 520 can be disposed over a whole display area, can include a conductive material with a relatively low work function value compared to the first electrode 510, and can be a cathode. For example, the second electrode 520 can include, but is not limited to, a highly reflective material such as Al, Mg, Ca, Ag, alloy thereof, and/or combinations thereof such as Al—Mg.

The color filter layer 480 is disposed between the first substrate 402 and the OLED D, for example, the interlayer insulating layer 440 and the passivation layer 460. The color filter layer 480 can include a red color filter pattern 482, a green color filter pattern 484 and a blue color filter pattern 486 each of which is disposed correspondingly to the red pixel region RP, the green pixel region GP and the blue pixel region BP, respectively.

In addition, an encapsulation film 470 can be disposed on the second electrode 520 in order to prevent or reduce outer moisture from penetrating into the OLED D. The encapsulation film 470 can have, but is not limited to, a laminated structure including a first inorganic insulating film, an organic insulating film and a second inorganic insulating film (e.g., film 170 in FIG. 2). In addition, a polarizing plate can be attached onto the second substrate 404 to reduce reflection of external light. For example, the polarizing plate can be a circular polarizing plate.

In FIG. 6, the light emitted from the OLED D is transmitted through the first electrode 510 and the color filter layer 480 is disposed under the OLED D. The organic light emitting display device 400 can be a bottom-emission type. Alternatively, the light emitted from the OLED D is transmitted through the second electrode 520 and the color filter layer 480 can be disposed on the OLED D when the organic light emitting display device 400 is a top-emission type. In this case, the color filter layer 480 can be attached to the OLED D by adhesive layer. Alternatively, the color filter layer 480 can be disposed directly on the OLED D.

In addition, a color conversion layer can be formed or disposed between the OLED D and the color filter layer 480. The color conversion layer can include a red color conversion layer, a green color conversion layer and a blue color conversion layer each of which is disposed correspondingly to each pixel region (RP, GP and BP), respectively, so as to convert the white (W) color light to each of a red, green and blue color lights, respectively. For example, the color conversion layer can include quantum dots so that the color purity of the organic light emitting display device 400 can be further improved. Alternatively, the organic light emitting display device 400 can comprise the color conversion layer instead of the color filter layer 480.

As described above, the white (W) color light emitted from the OLED D is transmitted through the red color filter pattern 482, the green color filter pattern 484 and the blue color filter pattern 486 each of which is disposed correspondingly to the red pixel region RP, the green pixel region GP and the blue pixel region BP, respectively, so that red, green and blue color lights are displayed in the red pixel region RP, the green pixel region GP and the blue pixel region BP, respectively.

An OLED that can be applied into the organic light emitting display device will now be described in more detail. An example of the OLED D of FIG. 6 is shown in FIG. 7 as an OLED D2. Particularly, FIG. 7 illustrates a schematic cross-sectional view of an organic light emitting diode having a tandem structure of three emitting parts.

As illustrated in FIG. 7, the OLED D2 in accordance with the embodiment of the present disclosure includes a first electrode 510, a second electrode 520 facing to the first electrode 510, and an emissive layer 530 disposed between the first and second electrodes 510 and 520. The emissive layer 530 includes a first emitting part 600 disposed between the first and second electrodes 510 and 520, a second emitting part 700 disposed between the first emitting part 600 and the second electrode 520, a third emitting part 800 disposed between the second emitting part 700 and the second electrode 520, a first charge generation layer (CGL1) 690 disposed between the first and second emitting parts 600 and 700, and a second charge generation layer (CGL2) 790 disposed between the second and third emitting parts 700 and 800.

The first electrode 510 can be an anode and can include a conductive material having relatively high work function value such as TCO. The second electrode 520 can be a cathode and can include a conductive material with a relatively low work function value, for example, a highly reflective material.

The first emitting part 600 includes a first emitting material layer (EML1) 640. The first emitting part 600 can include at least one of a hole injection layer (HIL) 610 disposed between the first electrode 510 and the EML1 640, a first hole transport layer (HTL1) 620 disposed between the HIL 610 and the EML1 640, and a first electron transport layer (ETL1) 680 disposed between the EML1 640 and the CGL1 690. Alternatively, the first emitting part 600 can further include a first electron blocking layer (EBL1) 630 disposed between the HTL1 620 and the EML1 640 and/or a first hole blocking layer (HBL1) 670 disposed between the EML1 640 and the ETL1 680.

The second emitting part 700 includes a second emitting material layer (EML2) 740. The second emitting part 700 can include at least one of a second hole transport layer (HTL2) 720 disposed between the CGL1 690 and the EML2 740 and a second electron transport layer (ETL2) 780 disposed between the EML2 740 and the CGL2 790. Alternatively, the second emitting part 700 can further include at least one of a second electron blocking layer 730 (EBL2) disposed between the HTL2 720 and the EML2 740 and a second hole blocking layer (HBL2) 770 disposed between the EML2 740 and the ETL2 780.

The third emitting part 800 includes a third emitting material layer (EML3) 840. The third emitting part 800 can include at least one of a third hole transport layer (HTL3) 820 disposed between the CGL2 790 and the EML3 840, a third electron transport layer (ETL3) 880 disposed between the EML3 840 and the second electrode 520, and an electron injection layer (EIL) 890 disposed between the ETL3 880 and the second electrode 520. Alternatively, the third emitting part 800 can further include at least one of a third electron blocking layer (EBL3) 830 disposed between the HTL3 820 and the EML3 840 and a third hole blocking layer (HBL3) 870 disposed between the EML3 840 and the ETL3 880.

The HIL 610 is disposed between the first electrode 510 and the HTL1 620 and improves an interface property between the inorganic first electrode 510 and the organic HTL1 620. In one embodiment, a hole injecting material in the HIL 610 can include, but is not limited to, MTDATA, NATA, 1T-NATA, 2T-NATA, CuPc, TCTA, NPB (NPD), DNTPD, HAT-CN, F4-TCNA, F6-TCNNQ, TDAPB, PEDOT/PSS, N-(biphenyl-4-yl)-9,9-dimethyl-N-(4-(9-phenyl-9H-carbazol-3-yl)phenyl)-9H-fluoren-2-amine, NPNPB, TAPC, BPBPA, $MgF_2$, $CaF_2$ and/or combinations thereof. Alternatively, the HIL 610 can include the hole transporting material doped with the hole injecting material. In certain embodiments, the HIL 610 can be omitted in compliance of the OLED D2 property.

The HTL1 620, the HTL2 720 and the HTL3 820 can facilitate the hole transportation in the first emitting part 600, the second emitting part 700 and the third emitting part 800, respectively. In one embodiment, a hole transporting material in each of the HTL1 620, the HTL2 720 and the HTL3 820 can independently include, but is not limited to, TPD, NPB (NPD), CBP, DNTPD, BPBPA, NPNPB, Poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine and/or combination thereof.

The ETL1 680, the ETL2 780 and the ETL3 880 can facilitate electron transportation in the first emitting part 600, the second emitting part 700 and the third emitting part 800, respectively. As an example, electron transporting material in each of the ETL1 680, the ETL2 780 and the ETL3 880 can independently include at least one of an oxadiazole-based compound, a triazole-based compound, a phenanthroline-based compound, a benzoxazole-based compound, a benzothiazole-based compound, a benzimidazole-based compound and a triazine-based compound. For example, electron transporting material in each of the ETL1 660, the ETL2 760 and the ETL3 860 can independently include, but is not limited to, $Alq_3$, PBD, spiro-PBD, Liq, TPBi, BAlq, Bphen, NBphen, BCP, TAZ, NTAZ, TpPyPB, TmPPPyTz, PFNBr, TPQ, TSPO1, ZADN, the electron transporting material in Chemical Formula 5 and/or combinations thereof.

The EIL 890 is disposed between the second electrode 520 and the ETL3 880, and can improve physical properties of the second electrode 520 and therefore, can enhance the lifespan of the OLED D2. In one embodiment, electron injecting material in the EIL 890 can include, but is not limited to, an alkali metal halide or an alkaline earth metal halide such as LiF, CsF, NaF, $BaF_2$ and the like, and/or an organometallic Compound such as Liq, lithium benzoate, sodium stearate, and the like.

An electron blocking material in each of the EBL1 630, the EBL2 730 and the EBL3 830 can independently include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB, DCDPA, 2,8-bis(9-phenyl-9H-carbazol-3-yl)dibenzo[b,d]thiophene and/or combinations thereof, respectively.

A hole blocking material in each of the HBL1 670, the HBL2 770 and the HBL3 870 can include, but is not limited to, at least one of an oxadiazole-based compound, a triazole-based compound, a phenanthroline-based compound, a benzoxazole-based compound, a benzothiazole-based compound, a benzimidazole-based compound, and a triazine-based compound. For example, hole blocking material in each of the HBL1 670, the HBL2 770 and the HBL3 870 can independently include, but is not limited to, BCP, BAlq, $Alq_3$, PBD, spiro-PBD, Liq, B3PYMPM, DPEPO, 9-(6-(9H-carbazol-9-yl)pyridine-3-yl)-9H-3,9'-bicarbazole, TSPO1 and/or combinations thereof, respectively.

The CGL1 690 is disposed between the first emitting part 600 and the second emitting part 700. The CGL1 690 includes a first N-type CGL (N-CGL1) 692 disposed between the ETL1 680 and the HTL2 720 and a first P-type CGL (P-CGL1) 694 disposed between the N-CGL1 692 and the HTL2 720. The CGL2 790 is disposed between the second emitting part 700 and the third emitting part 800. The CGL2 790 includes a second N-type CGL (N-CGL2) 792 disposed between the ETL2 780 and the HTL3 820 and a second P-type CGL (P-CGL2) 794 disposed between the N-CGL2 792 and the HTL3 820.

Each of the N-CGL1 692 and the N-CGL2 792 provides electrons to the EML1 640 of the first emitting part 600 and the EML2 740 of the second emitting part 700, respectively. Each of the P-CGL1 694 and the P-CGL2 794 provides holes to the EML2 740 of the second emitting part 700 and the EML3 840 of the third emitting part 800, respectively.

Each of the N-CGL1 692 and the N-CGL2 792 can be an organic layer with electron transporting material doped with an alkali metal such as Li, Na, K and Cs and/or an alkaline earth metal such as Mg, Sr, Ba and Ra. For example, the contents of the alkali metal and/or the alkaline earth metal in each of the N-CGL1 692 and the N-CGL2 792 can be, but is not limited to, between about 0.1 wt % and about 30 wt %, for example, about 1 wt % and about 10 wt %.

In one embodiment, each of the P-CGL1 694 and the P-CGL2 794 can include, but is not limited to, inorganic material selected from the group consisting of $WO_x$, $MoO_x$, $Be_2O_3$, $V_2O_5$ and/or combinations thereof. In another embodiment, each of the P-CGL1 694 and the P-CGL2 794 can include organic material of the hole transporting material doped with the hole injecting material (e.g., organic material such as HAT-CN, F4-TCNQ and/or F6-TCNNQ and/or inorganic material such as $MgF_2$ and/or $CaF_2$). In this case, the contents of the hole injecting material in the P-CGL1 694 and the P-CGL2 794 can be, but is not limited to, between about 2 wt % and about 15 wt %.

In one embodiment, two of the EML1 640, the EML2 740 and the EML3 840 can emit blue color light and the other of the EML1 640, the EML2 740 and the EML3 840 can emit red to green color light, so that the OLED D2 can realize white (W) emission. Hereinafter, the OLED D2 where the EML1 640 and the EML3 840 emit blue color light and the EML2 740 emits red to green color light will be described in more detail.

The EML1 640 can include a lower first blue emitting material layer (lower B-EML1 or bottom B-EML1) 650 and a lower second blue emitting material layer (lower B-EML2 or bottom B-EML2) 660 disposed between the lower B-EML1 650 and the CGL1 690. The lower B-EML1 650 comprises a first host 652 and a first blue emitter 654, and the lower B-EML2 660 comprises a second host 662 and a second blue emitter 664.

The EML3 840 can include an upper first blue emitting material layer (upper B-EML1 or top B-EML1) 850 and an upper second blue emitting material layer (upper B-EML2 or top B-EML2) 860 disposed between the upper B-EML1 850 and the second electrode 520. The upper B-EML1 850 comprises a first host 852 and a first blue emitter 854, and the upper B-EML2 860 comprises a second host 862 and a second blue emitter 864.

Each of the first hosts 652 and 852 can be independently the pyrene-based organic compound having the structure of Chemical Formulae 1 to 2. Each of the second hosts 662 and 862 can be independently the anthracene-based organic compound having the structure of Chemical Formulae 3 to 4.

The materials, HOMO energy levels, LUMO energy levels, charge mobility, excited singlet energy levels and excited triplet energy levels of the first hosts 652 and 852, the second hosts 662 and 862, the first blue emitters 654 and 854 and the second blue emitters 664 and 864 as well as the contents of those materials in the first blue emitting material layers 650 and 850 and the second blue emitting material layers 660 and 860 can be identical to the corresponding material and the contents with referring to FIGS. 3 to 5.

In one embodiments, each of the first blue emitters 654 and 854 in the first blue emitting material layers 650 and 850 can be identical to or different from each of the second blue emitters 664 and 864 in the second blue emitting material layers 660 and 860, respectively. In another embodiment, the first host 652 in the lower B-EML1 650 can have a HOMO energy level higher than a HOMO energy level of the EBL1 630, but is not limited thereto. In further another embodiment, the first hosts 852 in the upper B-EML1 850 can have a HOMO energy level higher than a HOMO energy level of the EBL3 830, but is not limited thereto.

Each of the EML1 640 and the EML3 840 can be a blue EML, a sky-blue EML or a deep-blue EML.

The first host 652 in the lower B-EML1 650 can be identical to or different form the first host 852 in the upper B-EML1 850. The first blue emitter 654 in the lower B-EML1 650 can be identical to or different from the first blue emitter 854 in the upper B-EML1 850. The second host 662 in the lower B-EML2 660 can be identical to or different form the second host 862 in the upper B-EML2 860. The second blue emitter 664 in the lower B-EML2 660 can be identical to or different from the second blue emitter 864 in the upper B-EML2 860.

Alternatively, one of the EML1 640 and the EML3 840 can have different configurations. For example, one of the EML1 640 and the EML3 840 can have a single-layered structure including a blue host and a blue emitter. The blue host included in one of the EML1 640 and the EML3 840 can include a P-type blue host and/or an N-type blue host, and the blue emitter included in one of the EML1 640 and the EML3 840 can include at least one of blue phosphorescent material, blue fluorescent material and blue delayed fluorescent material.

In one embodiment, the P-type blue host can include, but is not limited to, an aryl amine- or hetero aryl amine-based organic compound substituted with at least one aromatic and/or hetero aromatic group, a carbazole-based organic compound and/or a spirofluorene-based organic compound. The N-type blue host can include, but is not limited to, an azine-based organic compound and/or a benzimidazole-based organic compound.

For example, when one of the EML1 640 and the EML3 840 is the blue emitting material layer with the single-layered structure, the blue host in the single-layered blue emitting material layer can include, but is not limited to, 1,3-Bis(carbazol-9-yl)benzene (mCP), 9-(3-(9H-carbazol-9-yl)phenyl)-9H-carbazole-3-carbonitrile (mCP-CN), 3,3-Di (9H-carbazol-9-yl)biphenyl (mCBP), CBP-CN, 9-(3-(9H-Carbazol-9-yl)phenyl)-3-(diphenylphosphoryl)-9H-carbazole (mCPPO1) 3,5-Di(9H-carbazol-9-yl)biphenyl (Ph-mCP), Diphenyl-4-triphenylsilyl-phenylphosphine oxide (TSPO1), 9-(3'-(9H-carbazol-9-yl)-[1,1'-biphenyl]-3-yl)-9H-pyrido[2,3-b]indole (CzBPCb), Bis(2-methylphenyl)diphenylsilane (UGH-1), 1,4-Bis(triphenylsilyl)benzene (UGH-2), 1,3-Bis(triphenylsilyl)benzene (UGH-3), 9,9-Spirobifluoren-2-yl-diphenyl-phosphine oxide (SPPO1), 9,9'-(5-(Triphenylsilyl)-1,3-phenylene)bis(9H-carbazole) (SimCP), MADN and/or combinations thereof.

The blue emitter in the blue emitting material layer with the single-layered structure can be identical to the first blue emitters 654 and 854 and/or the second blue emitters 664 and 864.

The contents of the blue host in the single-layered blue emitting material layer can be about 50 wt % to about 99 wt %, for example, about 80 wt % to about 95 wt %, and the contents of the blue emitter in the single-layered blue emitting material layer can be about 1 wt % to about 50 wt %, for example, about 5 wt % to about 20 wt %, but is not limited thereto. When the single-layered blue emitting material layer includes both the P-type blue host and the N-type blue host, the P-type host and the N-type host can be mixed, but is not limited to, with a weight ratio of about 4:1 to about 1:4, for example, about 3:1 to about 1:3.

At least one of the first emitting part 600 and the third emitting part 800 includes two blue emitting material layers including the first hosts 652 and 852 and the second hosts 662 and 862 having controlled energy levels and charge mobility. Exciton recombination zone is formed within the EML1 640 or the EML3 840 irrespective of the current density changes, color changes can be minimized. As the non-emitting excitons outside of the EML1 and EML3 640 and 840 minimizes, it is possible to suppress the degradation of charge transporting or charge blocking materials.

As each of the first hosts 652 and 852 and the second hosts 662 and 862 having a controlled energy level and/or charge mobility is applied into the first blue emitting material layers 650 and 850 and the second blue emitting material layers 660 and 860, holes can be transferred rapidly to the second blue emitting material layers 660 and 860 from the first blue emitting material layers 650 and 850. The second blue emitting material layers 660 and 860 including the second hosts 662 and 862 with relatively low HOMO energy levels are disposed adjacently to the ETL1 680 and the ETL3 880, respectively, holes cannot be leaked to the ETL1 680 and the ETL3 880. As the color changes by gradation changes minimizes, it is possible to realize high quality colors. The driving voltage and power consumption of the OLED D2 can be lowered, and the luminous efficiency and the luminous lifespan of the OLED can be improved.

The EML2 740 includes a first layer 740A disposed between the EBL2 730 and the HBL2 770, a second layer 740B disposed between the first layer 740A and the HBL2 770, and optionally, a third layer 740C disposed between the first layer 740A and the second layer 740B. One of the first layer 740A and the second layer 740B can emit red color light and the other of the first layer 740A and the second layer 740B can emit green color light. Hereinafter, the OLED D2 where the first layer 740A emits red color light and the second layer 740B emits green color light will be described in more detail.

The first layer 740A can include a red host and a red emitter (red dopant), the second layer 740B can include a green host and a green emitter (green dopant) and the third layer 740C can include a yellow-green host and a yellow-green emitter (yellow-green dopant). The red host can include at least one of a P-type red host and an N-type red host, the green host can include at least one of a P-type green host and an N-type green host and the yellow-green host can include at least one of a P-type yellow-green host and an N-type yellow-green host.

Each of the P-type red host, the P-type green host and the P-type yellow-green host can independently include at least one of an amine-based organic compound substituted with at least one aromatic and/or hetero aromatic group, a carbazole-based organic compound and a spirofluorene-based organic compound. Each of the N-type red host, the N-type green host and the N-type yellow-green host can independently include at least one of an azine-based organic compound, a benzimidazole-based organic compound and a quinazoline-based organic compound, but is not limited thereto.

In one embodiment, each of the red host, the green host and the yellow-green host can independently include, but is not limited to, mCP-CN, CBP, mCBP, mCP, DPEPO, 2,8-bis(diphenylphosphoryl)dibenzothiophene (PPT), 1,3,5-Tris[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-biphenyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), TSPO1, 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicarbazole, 9,9'-Diphenyl-9H,9'H-3,3'-bicarbazole (BCzPh), 1,3,5-Tris(carbazol-9-yl)benzene (TCP), TCTA, 4,4'-Bis(carbazole-9-yl)-2,2'-dimethylbiphenyl (CDBP), 2,7-Bis(carbazole-9-yl)-9,9-dimethylfluorene (DMFL-CBP), 2,2',7,7'-Tetrakis(carbazol-9-yl)-9,9-spirofluorene (Spiro-CBP), 3,6-Bis(carbazole-9-yl)-9-(2-ethyl-hexyl)-9H-carbazole (TCz1), BPBPA, 1,3,5-Tris(N-phenylbenzimidazol-2-yl)benzene (TPBi) and/or combinations thereof.

The red emitter in the first layer 740A can include at least one of red phosphorescent material, red fluorescent material and red delayed fluorescent material. For example, the red emitter can include, but is not limited to, Bis[2-(4,6-dimethyl)phenylquinoline](2,2,6,6-tetramethylheptane-3,5-dionate)iridium(III), Bis[2-(4-n-hexylphenyl)quinoline](acetylacetonate)iridium(III) (Hex-Ir(phq)$_2$(acac)), Tris[2-(4-n-hexylphenyl)quinoline]iridium(III) (Hex-Ir(phq)$_3$), Tris[2-phenyl-4-methylquinoline]iridium(III) (Ir(Mphq)$_3$), Bis(2-phenylquinolinex2,2,6,6-tetramethylheptene-3,5-dionate)iridium(III) (Ir(dpm)PQ$_2$), Tris(1-phenylisoquinoline)iridium(III) (Ir(piq)$_3$), Bis(phenylisoquinoline)(2,2,6,6-tetramethylheptene-3,5-dionate)iridium(III) (Ir(dpm)(piq)$_2$), Bis(1-phenylisoquinoline)(acetylacetonate)iridium(III) (Ir(piq)$_2$(acac)), Bis[(4-n-hexylphenyl)isoquinoline](acetylacetonate)iridium(III) (Hex-Ir(piq)$_2$(acac)), Tris[2-(4-n-hexylphenyl)quinoline]iridium(III) (Hex-Ir(piq)$_3$), Tris(2-(3-methylphenyl)-7-methyl-quinolato)iridium (Ir(dmpq)$_3$), Bis[2-(2-methylphenyl)-7-methyl-quinoline](acetylacetonate)iridium(III) (Ir(dmpq)$_2$(acac)), Bis[2-(3,5-dimethylphenyl)-4-methyl-quinoline](acetylacetonate)iridium(III) (Ir(mphmq)$_2$(acac)), Tris(dibenzoylmethane)mono(1,10-phenanthroline)europium(III) (Eu(dbm)$_3$(phen)) and/or combinations thereof.

The green emitter in the second layer 740B can include at least one of green phosphorescent material, green fluorescent material and green delayed fluorescent material. For example, the green emitter can include, but is not limited to, [Bis(2-phenylpyridine)](pyridyl-2-benzofuro[2,3-b]pyridine)iridium, Tris[2-phenylpyridine]iridium(III) (Ir(ppy)$_3$), fac-Tris(2-phenylpyridine)iridium(III) (fac-Ir(ppy)$_3$), Bis(2-phenylpyridine)(acetylacetonate)iridium(III) (Ir(ppy)$_2$(acac)), Tris[2-(p-tolyl)pyridine]iridium(III) (Ir(mppy)$_3$), Bis(2-(naphthalene-2-yl)pyridine)(acetylacetonate)iridium(III) (Ir(npy)$_2$acac), Tris(2-phenyl-3-methyl-pyridine)iridium (Ir(3mppy)$_3$), fac-Tris(2-(3-p-xylyl)phenyl)pyridine iridium(III) (TEG) and/or combinations thereof.

The yellow-green emitter in the third layer 740C can include at least one of yellow-green phosphorescent material, yellow-green fluorescent material and yellow-green delayed fluorescent material. For example, the yellow-green emitter can include, but is not limited to, 5,6,11,12-Tetraphenylnaphthalene (Rubrene), 2,8-Di-tert-butyl-5,11-bis(4-tert-butylphenyl)-6,12-diphenyltetracene (TBRb), Bis(2-phenylbenzothiazolato)(acetylacetonate)iridium(III) (Ir(BT)$_2$(acac)), Bis(2-(9,9-diethyl-fluoren-2-yl)-1-phenyl-1H-benzo[d]imdiazolatoxacetylacetonate)iridium(III) (Ir(fbi)$_2$(acac)), Bis(2-phenylpyridine)(3-(pyridine-2-yl)-2H-chromen-2-onate)iridium(III) (fac-Ir(ppy)$_2$Pc), Bis(2-(2,4-difluorophenyl)quinoline)(picolinate)iridium(III) (FPQIrpic), Bis(4-phenylthieno[3,2-c]pyridinato-N,C2')(acetylacetonate) iridium(III) (PO-01) and/or combinations thereof. In certain embodiments, the third layer 740C can be omitted.

The contents of the host in each of the first layer 740A, the second layer 740B and the third layer 740C can be between about 50 wt % to about 99 wt %, for example, about 95 wt % to about 98 wt %, respectively, and the contents of the emitter in each of the first layer 740A, the second layer 740B and the third layer 740C can be between about 1 wt % to about 50 wt %, for example, about 2 wt/o to about 5 wt %, respectively, but is not limited thereto. When each of the first layer 740A, the second layer 740B and the third layer 740C includes the P-type host and the N-type host, respectively, the P-type host and the N-type host can be admixed with, but is not limited to, weight ratio of about 4:1 to about 1:4, for example, about 3:1 to about 1:3.

At least one of the EML1 640 and the EML3 840 includes the first blue emitting material layer 650 or 850 including the first host 652 or 852, and the second blue emitting material layer 660 or 860 including the second host 662 or 862, so that the OLED D2 with beneficial luminous property can be realized. The OLED D2 has a tandem structure so that the color purity and luminous property of the OLED D2 can be further improved.

Example 1 (Ex. 1): Fabrication of OLED

An organic light emitting diode with single emitting part that comprises a first blue emitting material layer with a first host and a second blue emitting material layer with a second host was fabricated. A glass substrate onto which ITO (1200 Å) was coated as a thin film was washed and ultrasonically cleaned by solvent such as isopropyl alcohol, acetone and dried at 100° C. oven. The substrate was transferred to a vacuum chamber for depositing emissive layer as the following order:

Hole injection layer (HIL, DNTPD (50 wt %), $MgF_2$ (50 wt %), 70 Å); hole transport layer (HTL, DNTPD (HOMO: −5.58 eV, LUMO: −2.52 eV), 1000 Å); electron blocking layer (EBL, TCTA (HOMO: −5.8 eV, LUMO: −2.61 eV), 150 Å); first blue emitting material layer (B-EML1, Compound BH1-4 in Chemical Formula 2 (HOMO: −5.75 eV, LUMO: −2.75 eV, 98 wt %), DABNA-1 (2 wt %), 60 Å); second blue emitting material layer (B-EML2, Compound BH2-1 in Chemical Formula 4 (HOMO: −6.09 eV, LUMO: −3.17 eV, 98 wt %), DABNA-1 (2 wt %), 240 Å); electron transport layer (ETL, ZADN (HOMO: −6.18 eV, LUMO: −3.04 eV), 110 Å); electron injection layer (EIL, LIF, 15 Å); and cathode (Al, 100 Å).

The fabricated OLED was encapsulated with glass and then transferred from the deposition chamber to a dry box in order to form a film. Then, the OLED was encapsulated with UV-cured epoxy resin and water getter. The structures of a hole injecting material, a hole transporting material, an electron blocking material, a blue emitter and electron transporting material are illustrated in the following:

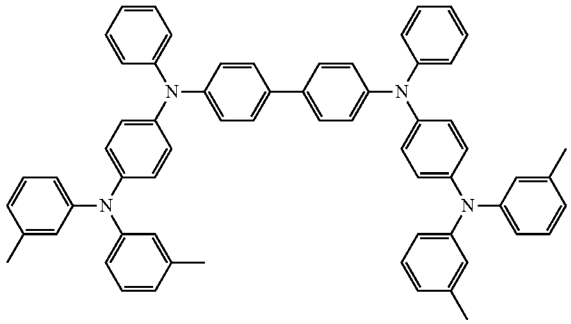

DNTPD

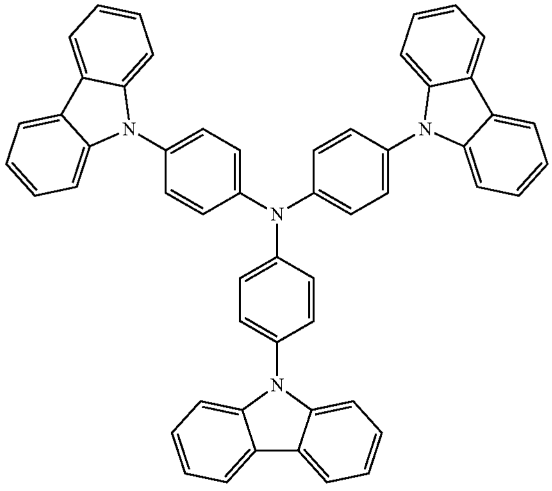

TCTA

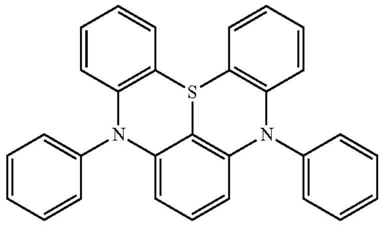

DABNA-1

-continued

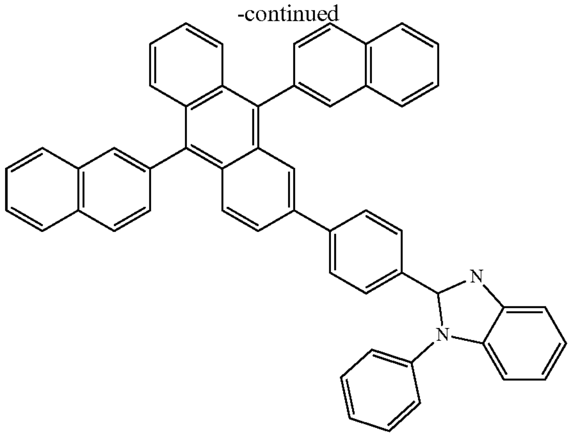

ZADN

Comparative Example 1 (Ref. 1): Fabrication of OLED

An OLED was fabricated using the same procedure and the same material as Example 1, except that the emitting material layer was modified to a single blue emitting material layer including the Compound BH2-1 (98 wt %) and the DABNA-1 (2 wt %) with a thickness of 300 Å.

Comparative Example 2 (Ref. 2): Fabrication of OLEDs

An OLED was fabricated using the same procedure and the same material as Comparative Example 1, except that the host in the blue emitting material layer was modified to Compound BH1-4 instead of the Compound BH2-1.

Experimental Example 1: Measurement of Luminous Properties of OLEDs

The luminous properties for each of the OLEDs, fabricated in Example 1 and Comparative Examples 1-2, were measured. Each of the OLEDs were connected to an external power source and then luminous properties for all the OLEDs were evaluated using a constant current source (KEITHLEY) and a photometer PR650 at room temperature. In particular, the changes of blue color coordinate (Blue CIEy, By) as the changes of current density for the OLEDs were measured. In addition, driving voltage (V, relative value), current efficiency (cd/A, relative value), External quantum efficiency (EQE, relative value) and luminous lifespan were measured. The measurement results are indicated in the following Tables 1-2 and FIG. 8.

TABLE 1

| Color Coordinate Change of OLED | | |
|---|---|---|
| Current Density | By | |
| [$mA/cm^2$] | Ref. 1 | Ex. 1 |
| 0.25 | 0.000 | 0.005 |
| 1.25 | 0.000 | 0.001 |
| 2.25 | 0.000 | 0.000 |

TABLE 1-continued

| Color Coordinate Change of OLED | | |
|---|---|---|
| Current Density | By | |
| [mA/cm$^2$] | Ref. 1 | Ex. 1 |
| 3.25 | 0.000 | 0.000 |
| 4.25 | 0.000 | 0.000 |
| 10 | 0.000 | 0.000 |

TABLE 2

| Luminous Properties of OLED | | | | |
|---|---|---|---|---|
| | IVL@10 mA/cm$^2$ | | | Lifespan |
| Sample | Volt (V) | cd/A | EQE | (%) |
| Ref. 1 | 0 | 100% | 100% | 100% |
| Ref. 2 | −0.38 | 60% | 49% | 63% |
| Ex. 1 | −0.15 | — | 104.5% | 168% |

Figure 8:
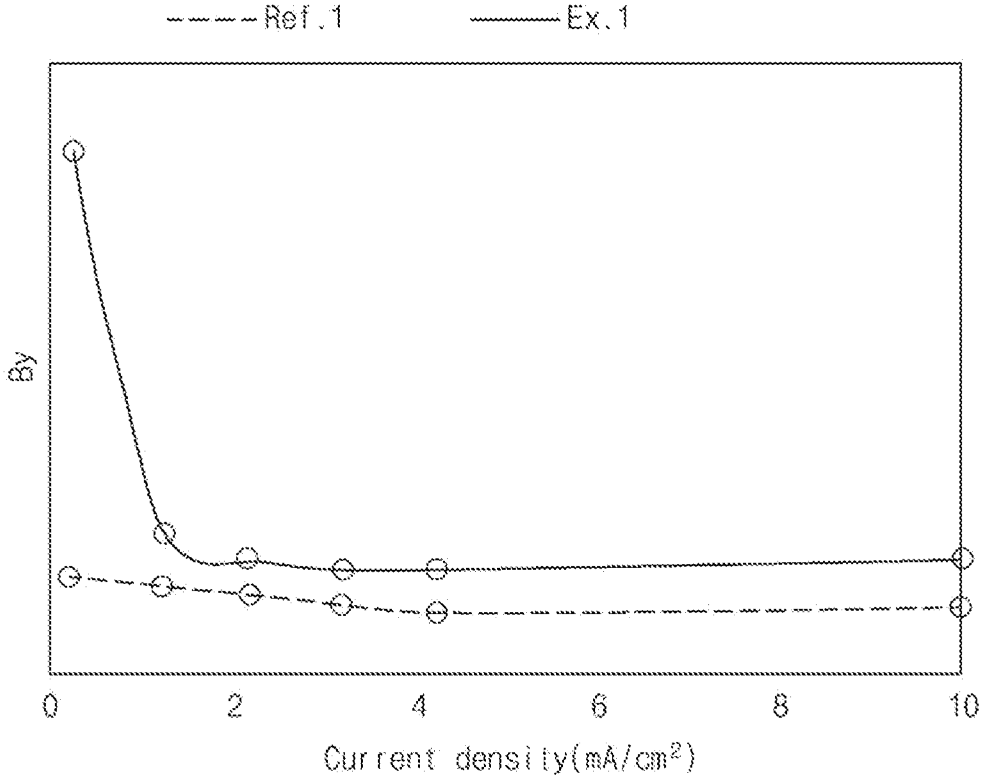
FIG. 8 illustrates a graph of showing measurement results of blue color coordinate changes (Blue CIEy, By) by the current density changes in an organic light emitting diode fabricated in Example or Comparative Example.

The first host in the B-EML1 in Example 1 emits light in a longer wavelength range than a emitting wavelength of the second host in the B-EML2 so that the OLED with the first host of Example 1 showed higher By value compared to the By value of the OLED with only the second host of the Comparative Example 1 in the low gradation range (current density of 0.25 to 1.25 mA/cm$^2$, as indicated in Table 1 and FIG. 8, owing to the emission of the first host. A portion of the exciton recombination zone (RCZ) is generated in the EBL in the OLED fabricated in Comparative Example 1 where the single blue emitting material layer with only the anthracene-based host so that non-emissive excitons are generated. On the contrary, the RCZ was generated through the B-EML1 to B-EML2 and the first host in the B-EML1 contributed to the exciton generation in the OLED fabricated in Example 1. It was confirmed that amount of non-emitting excitons can be minimized and color changes by gradation changes can be minimized by applying two blue emitting material layers each of which includes a first host and a second host having different energy levels and emission wavelengths.

As indicated in Table 2, when the single blue emitting material layer uses the first host of pyrene-based material, which has higher excited singlet energy level than the anthracene-based host, as Comparative Example 2, only the singlet excitons are generated without TTA, and the luminous efficiency and the luminous lifespan of the OLED was greatly decreased. On the contrary, in case of using two blue emitting material layers with controlled energy levels as Example 1, the driving voltage of the OLED can be lowered, and the luminous efficiency and the luminous lifespan of the OLED can be improved significantly.

Example 2 (Ex. 2): Fabrication of OLEDs

An OLED with three emitting parts where a lower blue emitting material layer consists of two emitting material layers was fabricated. The ITO-coated glass substrate was pre-treated as Example 1, and the organic layer was deposited at the deposition chamber as the following order:

Hole injection layer (HIL, DNTPD (50 wt %), $MgF_2$ (50 wt %), 70 Å); first hole transport layer (HTL1, DNTPD, 1000 Å); first electron blocking layer (EBL1, TCTA, 150 Å); lower first blue emitting material layer (lower B-EML1, Compound BH1-4 (98 wt %), DABNA-1 (2 wt %), 50 Å); lower second blue emitting material layer (lower B-EML2, Compound BH2-1 (98.5 wt %), DABNA-1 (1.5 wt %), 200 Å); first electron transport layer (ETL1, following ETL1-1, 110 Å); first N-type charge generation layer (N-CGL1, Bphen (98 wt %), $L^1$ (2 wt %), 130 Å); first P-type charge generation layer (P-CGL1, DNTPD (90 wt %), P-type dopant (10 wt %), 70 Å); second hole transport layer (HTL2, BPBPA, 70 Å); red emitting material layer (R-EML, host (BPBPA and TPBi by weight ratio of 5:5, 95 wt %), $Ir(piq)_2acac$ (5 wt %), 100 Å); yellow-green emitting material layer (YG-EML, host (CBP and TPBi by weight ratio of 5:5, 85 wt %), PO-01 (15 wt %), 100 Å); green emitting material layer (G-EML, host (CBP and TPBi by weight ratio of 5:5, 85 wt %), $Ir(ppy)_3$ (15 wt %), 200 Å); second electron transport layer (ETL2, TPBi, 200 Å); second N-type charge generation layer (N-CGL2, Bphen (97 wt %), Li (3 wt %), 200 Å), second P-type charge generation layer (P-CGL2, DNDPD (80 wt %), P-type dopant (20 wt %), 100 Å); third hole transport layer (HTL3, DNTPD, 500 Å); second electron blocking layer (EBL2, TCTA, 150 Å); upper blue emitting material layer (upper B-EML, BH2-1 (98 wt %), DABNA-1 (2 wt %), 300 Å); third electron transport layer (ETL3, ZADN, 200 Å); electron injection layer (EIL, LIF, 15 Å); and cathode (Al, 100 Å).

The fabricated OLED was treated as Example 1. The structures of a hole transporting material, an electron blocking material, an electron transporting material, a charge generating material, a red emitter, a yellow-green emitter and a green emitter not used in Example 1 are illustrated in the following:

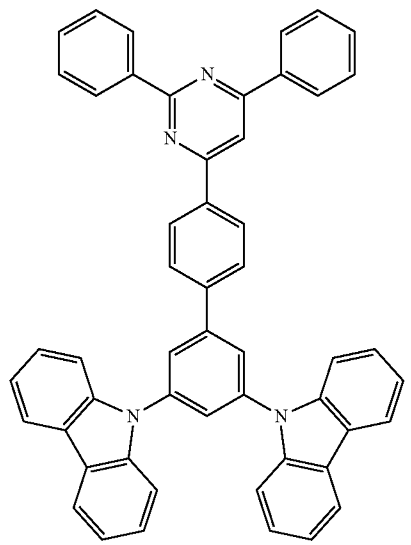

ETL1-1

-continued

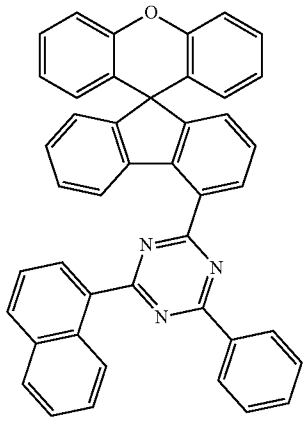

ETL1-2

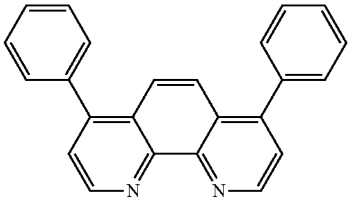

Bphen

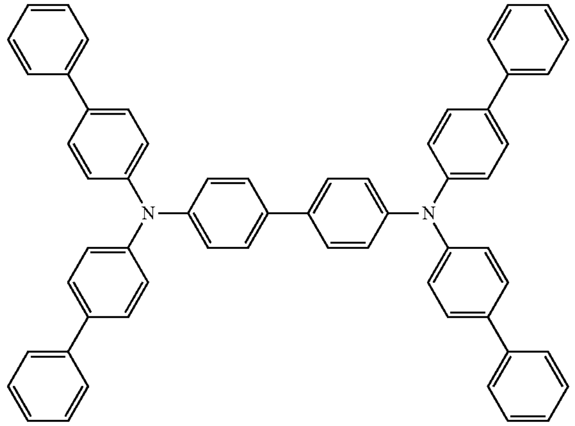

BPBPA

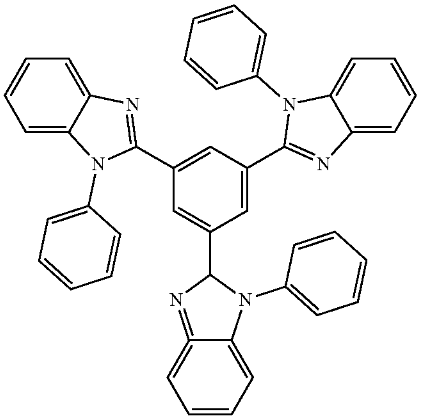

TPBi

-continued

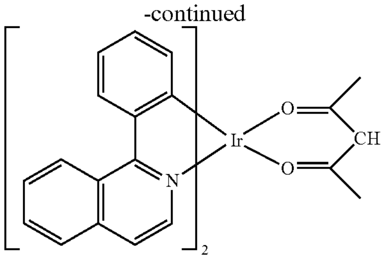

Ir(pig)$_2$acac

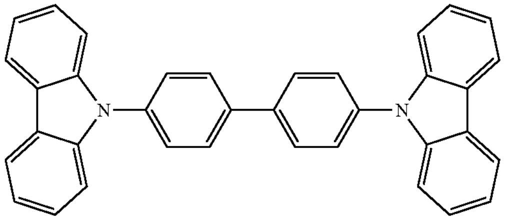

CBP

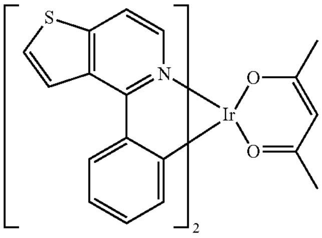

PO-01

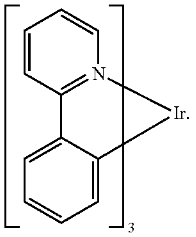

Ir(ppy)3

Example 3 (Ex. 3): Fabrication of OLED

An OLED was fabricated using the same procedure and the same material as Example 2, except that the electron transporting material in the ETL1 was modified to the Compound ETL1-2 having relatively slow electron mobility instead of Compound ETL1-1.

Comparative Example 3 (Ref. 3): Fabrication of OLED

An OLED was fabricated using the same procedure and the same material as Example 2, except that the lower blue emitting material layer was modified to a single blue emitting material layer including the Compound BH2-1 (98.5 wt %) and the DABNA-1 (1.5 wt %) with a thickness of 250 Å.

Comparative Example 4 (Ref. 4): Fabrication of OLED

An OLED was fabricated using the same procedure and the same material as Example 3, except that the lower blue emitting material layer was modified to a single blue emitting material layer including the Compound BH2-1 (98.5 wt %) and the DABNA-1 (1.5 wt %) with a thickness of 250 Å.

Experimental Example 2: Measurement of Luminous Properties of OLEDs

The luminous properties for each of the OLEDs, fabricated in Examples 2 to 3 and Comparative Examples 3 to 4, were measured as Experimental Example 1. In particular, the electroluminescence (EL) wavelength and the changes of white color coordinates (White CIEy, Wy) as the changes of current density for the OLEDs were measured. The measurement results are indicated in the following Table 3 and FIGS. 9 and 10.

TABLE 3

| Color Coordinate Changes of OLED | | | | |
|---|---|---|---|---|
| Current Density | Wy | | | |
| [mA/cm$^2$] | Ref. 3 | Ref. 4 | Ex. 2 | Ex. 3 |
| Δ0.25 J − 10 J | 0.036 | 0.034 | 0.025 | 0.025 |
| 0.25 | 0.000 | 0.000 | 0.000 | 0.000 |
| 1.25 | −0.016 | −0.014 | −0.009 | −0.009 |
| 2.25 | −0.021 | −0.019 | −0.013 | −0.013 |
| 3.25 | −0.025 | −0.023 | −0.016 | −0.015 |
| 4.25 | −0.028 | −0.025 | −0.018 | −0.017 |
| 5 | −0.029 | −0.027 | −0.019 | −0.019 |
| 10 | −0.036 | −0.034 | −0.025 | −0.025 |

Figure 9:
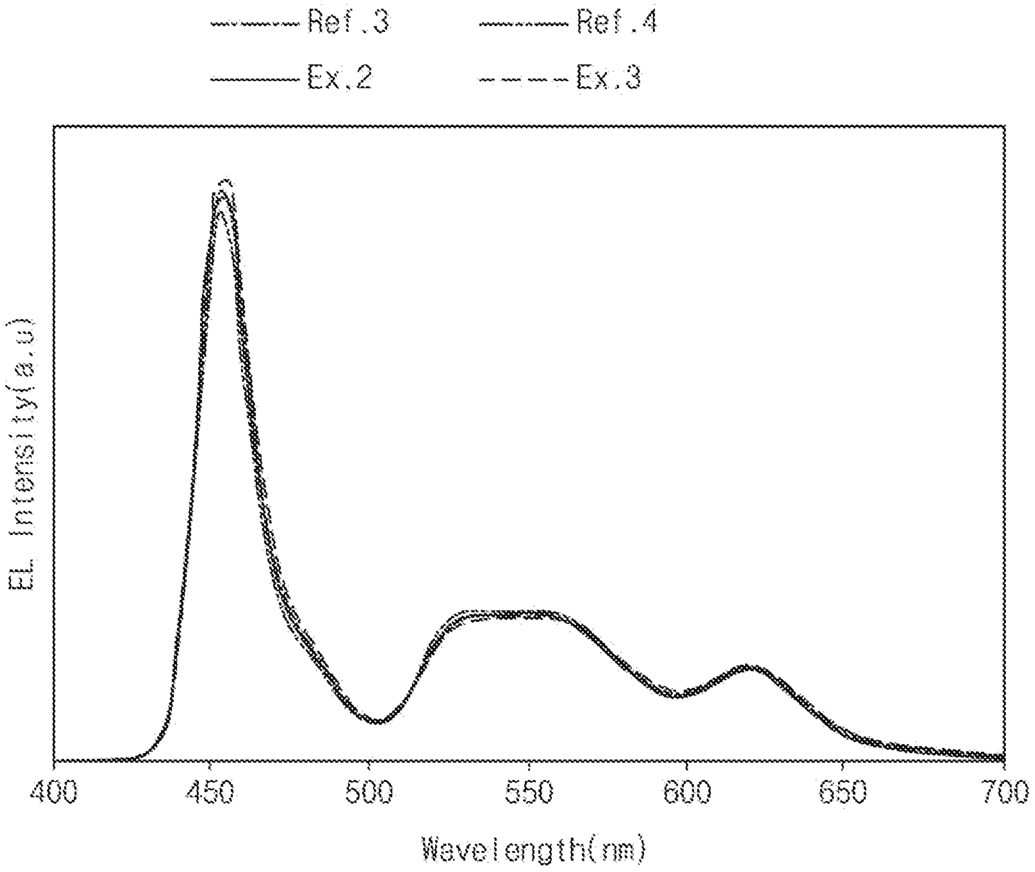
FIG. 9 illustrates a graph of showing measurement result of electroluminescence (EL) spectra in an organic light emitting diode fabricated in Examples or Comparative Examples.
Figure 10:
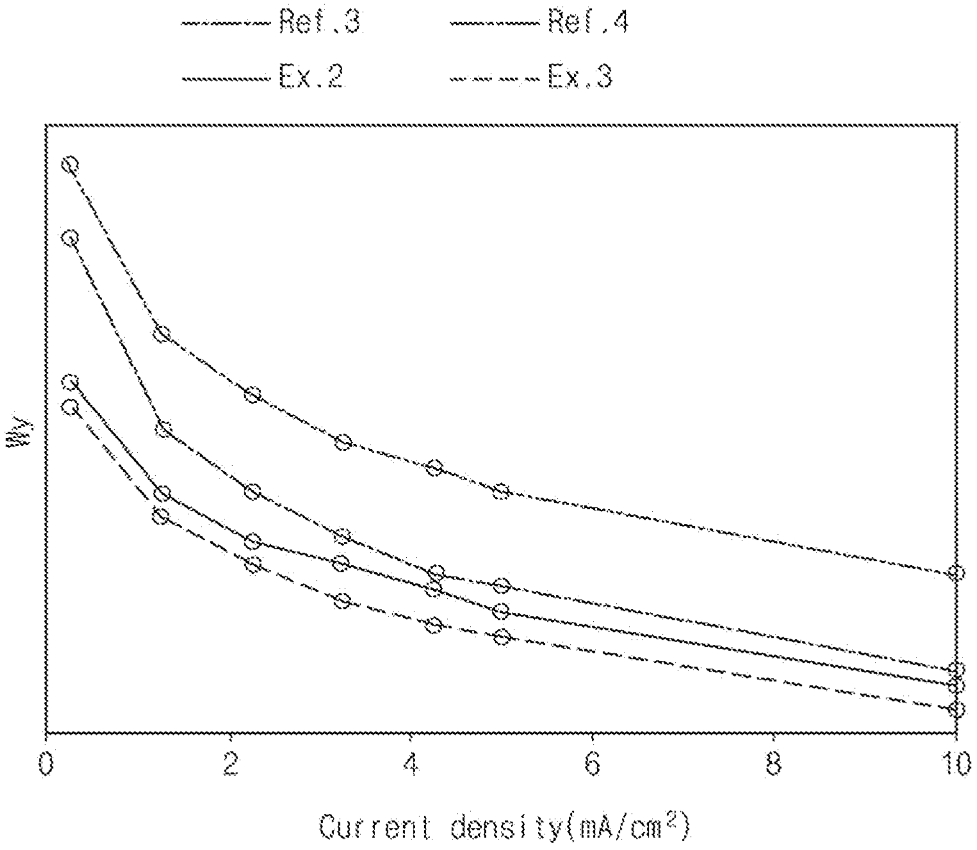
FIG. 10 illustrates a graph of showing measurement results of white color coordinate changes (white CIEy, Wy) by the current density changes in an organic light emitting diode fabricated in Examples or Comparative Examples.

As indicated in Table 3 as well as FIGS. 9 and 10, in the OLED fabricated in Comparative Example 3 where the single layered blue EML and electron transporting material ETL1-1 with relatively fast electron mobility were included, exciton recombination zone was generated on the EBL side. In the OLED fabricated in Comparative Example 4 where electron transporting material ETL1-2 with relatively slow electron mobility was included, exciton recombination zone was generated less on the EBL side. Accordingly, compared to the OLED fabricated in Comparative Example 3, in the OLED fabricated in Comparative Example 4, color was little changes by gradation changes (0.25 mA/cm$^2$-10 mA/cm$^2$) On the contrary, compared to Comparative Example 3, in the OLED of Comparative Example 4, the blue luminous efficiency was relatively low owing to low exciton recombination density and low chance of TTF. As the blue light ratio in the white emission spectrum is lower than that of Comparative Example 3, Wy value in Comparative Example 4 was increased.

On the contrary, in the OLEDs fabricated in Examples 2 and 3 each of which included two lower blue emitting material layers, the blue luminous efficiency was increased owing to reduction of non-emitting excitons in the low gradation range. Accordingly, the Wy value in the OLEDs of Examples 3-4 was reduced in the low gradation range (0.25 mA/cm$^2$-10 mA/cm$^2$) as well as the entire gradation range compared to the OLED of Comparative Example 3, because the blue color ratio in the white spectrum was increased. In other words, in the OLEDs of Examples 3 and 4, color was little changed by gradation changes in the low gradation range as well as the high gradation range.

Particularly, compared to the OLED fabricated in Comparative Example 3 where the electron transporting material with relatively fast electron mobility was applied, in the OLED fabricated in Example 2, color was further little changed in spite of gradation changes. As described above, in the OLED fabricated in Comparative Example 3 where an electron transporting material with relatively fast electron mobility was applied, the exciton recombination zone was generated more based towed the EBL, and TTF chance was higher than that of the OLED of Comparative Example 4, while more non-emitting excitons are generated in the OLED of Comparative Example 3. As in Example 2, when an electron transporting material with fast electron mobility and two EMLs are applied, it can be seen that the color improvement effect was greater.

Example 4 (Ex. 4): Fabrication of OLEDs

An OLED was fabricated using the same procedure and the same material as Example 2, except that the electron transporting material in ETL1 was modified ZADN instead of ETL1-1, and the upper blue emitting material layer of the third emitting part was modified to include an upper first blue emitting material layer (upper B-EML1) including Compound 1-4 in Chemical Formula 2 (98.5 wt %) and DABNA-1 (1.5 wt %) with a thickness of 50 Å and an upper second blue emitting material layer (upper B-EML2) including Compound 2-1 in Chemical Formula 4 (98.5 wt %) and DABNA-1 (1.5 wt %) with a thickness of 250 Å instead of single EML.

Example 5 (Ex. 5): Fabrication of OLED

An OLED was fabricated using the same procedure and the same material as Example 4, except that each of the lower B-EML1 and the upper B-EML1 had a thickness of 75 Å instead of 50 Å.

Example 6 (Ex. 6): Fabrication of OLED

An OLED was fabricated using the same procedure and the same material as Example 4, except that each of the lower B-EML1 and the upper B-EML1 had a thickness of 100 Å instead of 50 Å.

Comparative Example 5 (Ref. 5): Fabrication of OLED

An OLED was fabricated using the same procedure and the same material as Example 4, except that each of the lower blue emitting material layer and the upper blue emitting material layer modified to a single blue emitting material layer including the Compound BH2-1 (98.5 wt %) and the DABNA-1 (1.5 wt %) with a thickness of 250 Å.

Experimental Example 3: Measurement of Luminous Properties of OLEDs

The luminous properties for each of the OLEDs fabricated in Examples 4-6 and Comparative Example 5 were measured as Experimental Example 1. In particular, the electroluminescence (EL) wavelength, the changes of white color coordinates (White CIEy, Wy) as the changes of current density, driving voltage, blue CIEx (Bx), By and color coordinate changes at the current density of 100 mA/cm$^2$ for the OLEDs were measured. The measurement results are indicated in the following Table 4 and FIGS. 9 and 12.

TABLE 4

| Luminous Properties of OLED | | | | | | |
|---|---|---|---|---|---|---|
| | 100 mA/cm$^2$ | IVL@10 mA/cm$^2$ | | | | |
| Sample | Volt (V) | cd/A | Bx | By | ΔCIEx | ΔCIEy |
| Ref. 5 | 0.00 | 100% | 0.000 | 0.000 | 0.000 | 0.000 |
| Ex. 4 | −0.28 | 104% | 0.000 | 0.001 | −0.004 | −0.010 |
| Ex. 5 | −0.22 | 103% | −0.001 | 0.002 | −0.005 | −0.011 |
| Ex. 6 | −0.21 | 103% | −0.001 | 0.003 | −0.005 | −0.010 |

Figure 11:
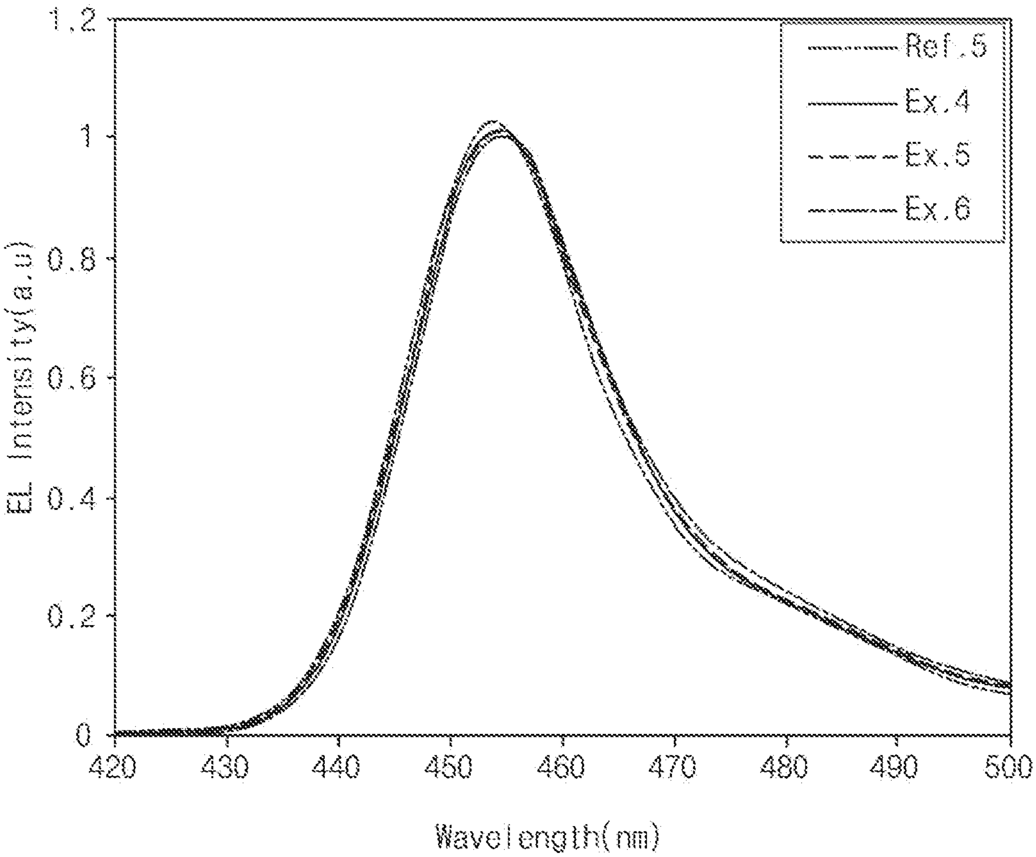
FIG. 11 illustrates a graph of showing measurement result of electroluminescence (EL) spectra in an organic light emitting diode fabricated in Examples or Comparative Examples.
Figure 12:
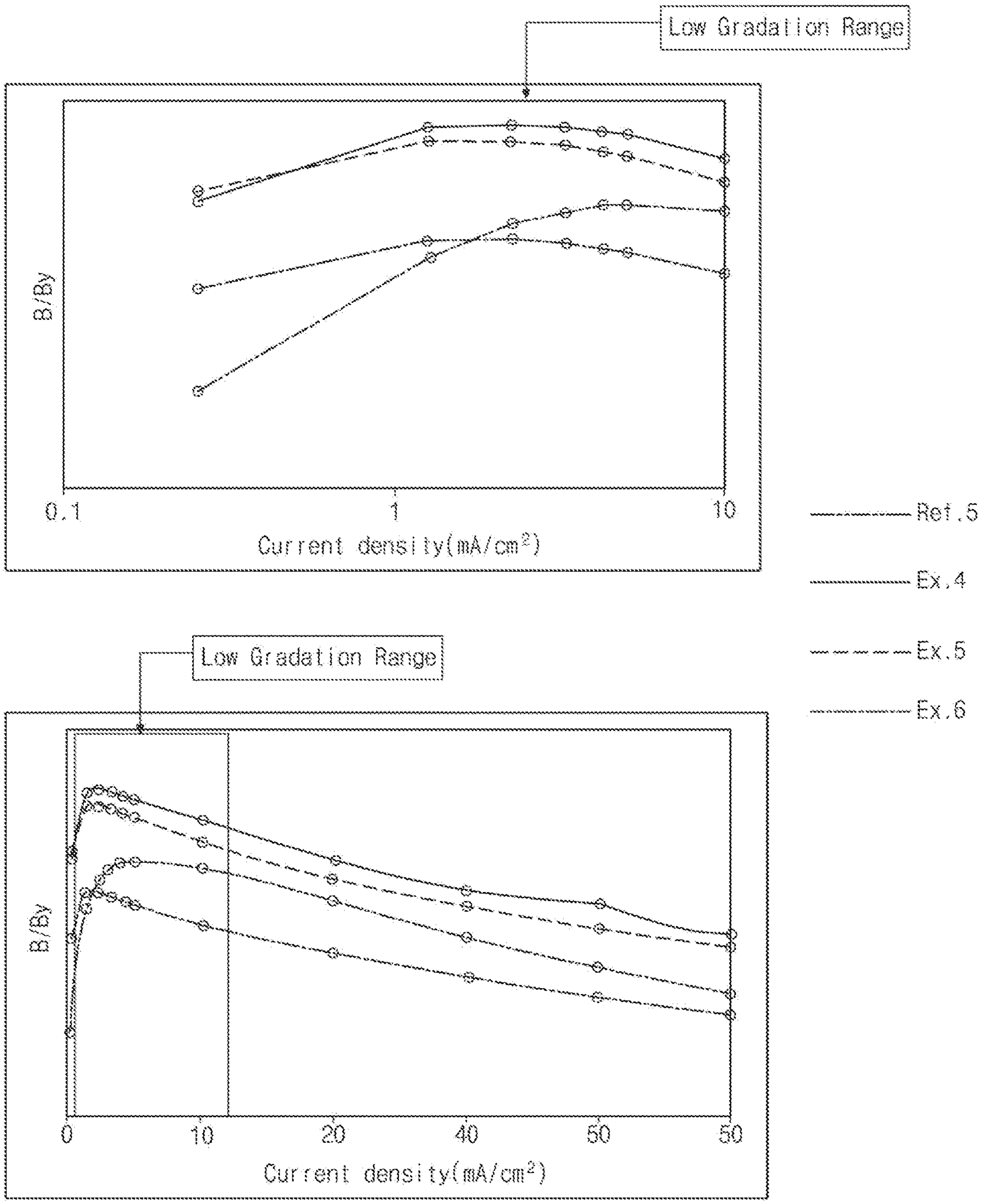
FIG. 12 illustrates a graph of showing measurement results of blue color coordinate changes (Blue CIEy, By) by the current density changes in an organic light emitting diode fabricated in Examples or Comparative Examples.

As indicated in Table 4 as well as FIGS. 11 and 12, in the OLED fabricated in Comparative Example 5 where the single-layered blue EML and the electron transporting material with relatively fast electron mobility were applied, exciton recombination zone was generated at an interface between the EBL and the EML. A portion of exciton recombination zone was generated at the EBL in the low gradation range so that color was greatly changed by gradation changes owing to the non-emitting or quenching excitons at the EBL. On the contrary, in the OLED fabricated in Examples 4 to 6 where two blue EMLs were applied, the exciton recombination zone was generated within the B-EML1 and B-EML2 in the low gradation range, and thus, luminous efficiency was increased and color was little changed owing to reduction of non-emitting excitons.

Example 7 (Ex. 7): Fabrication of OLED

An OLED was fabricated using the same procedure and the same material as Example 1, except that the contents of DABNA-1 in the B-EML1 was changed to 1 wt %, the thickness of the B-EML1 was modified to have 50 Å and the thickness of the B-EML2 was modified to have 250 Å.

Examples 8-9 (Ex. 8-9): Fabrication of OLED

An OLED was fabricated using the same procedure and the same material as Example 7, except that the thickness of the B-EML2 was modified to have 200 Å (Ex. 8) or 150 Å (Ex. 9).

Comparative Example 6 (Ref. 6): Fabrication of OLED

An OLED was fabricated using the same procedure and the same material as Example 7, except that the blue emitting material layer was modified to a single layer including BH2-1 (98 wt %) and DABNA-1 (2 wt %).

Experimental Example 4: Measurement of Luminous Properties of OLEDs

The luminous properties for each of the OLEDs, fabricated in Examples 7-9 and Comparative Example 6, were measured as Experimental Example 1. In particular, the changes of blue color coordinates (blue CIEy, By) as the changes of current density, driving voltage, blue CIEx (Bx), and By at the current density of 100 mA/cm$^2$ for the OLEDs were measured. The measurement results are indicated in the following Table 5 and FIG. 13.

TABLE 5

| Luminous Properties of OLED | | | | | |
|---|---|---|---|---|---|
| | 100 mA/cm$^2$ | IVL@10 mA/cm$^2$ | | | |
| Sample | Volt (V) | Volt (V) | cd/A | Bx | By |
| Ref. 6 | 0.00 | 0.00 | 100% | 0.000 | 0.000 |
| Ex. 7 | −0.10 | −0.10 | 100% | 0.000 | 0.001 |
| Ex. 8 | −0.24 | −0.18 | 102% | 0.000 | 0.004 |
| Ex. 9 | −0.36 | −0.26 | 98% | 0.000 | 0.002 |

Figure 13:
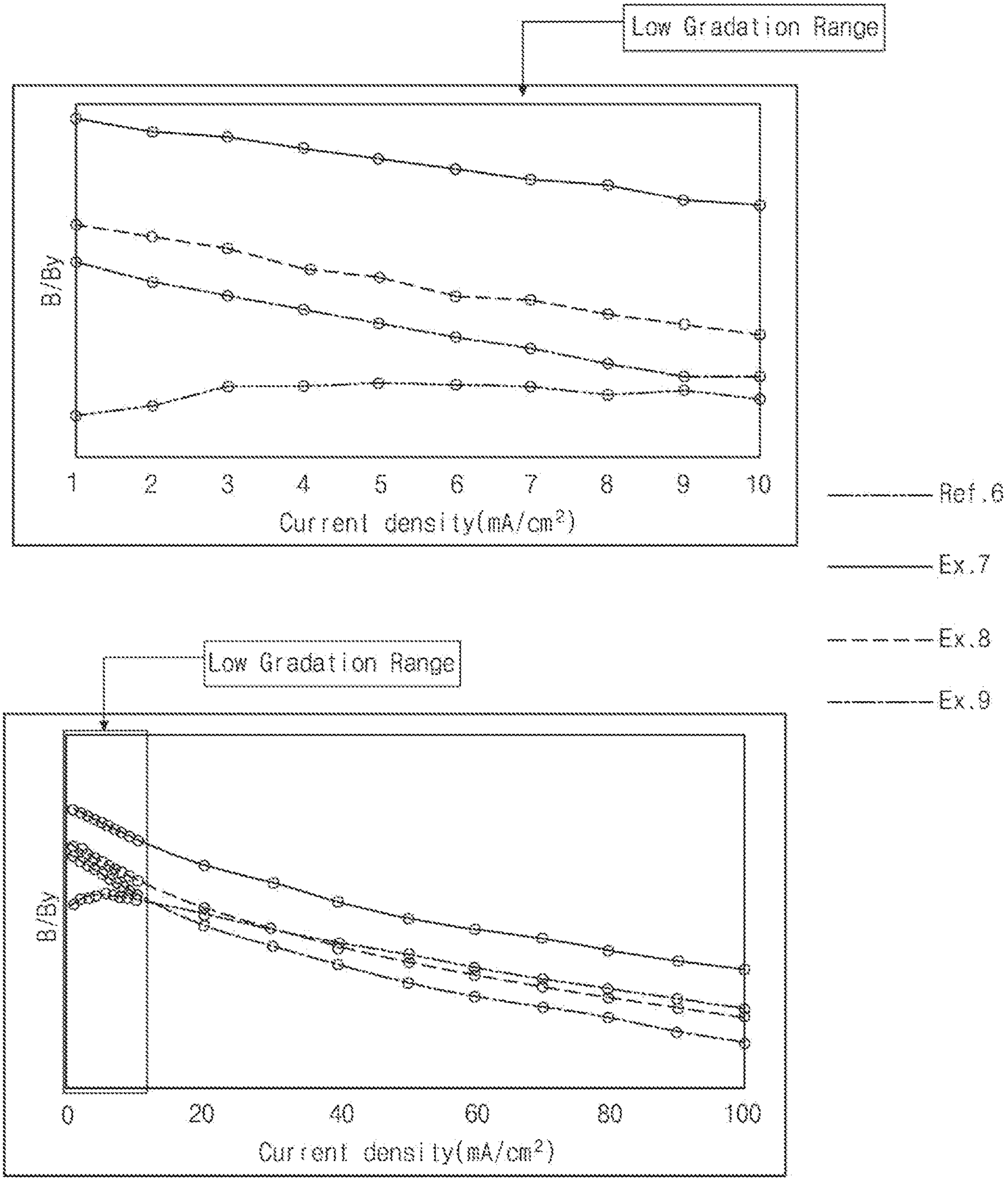
FIG. 13 illustrates a graph of showing measurement results of blue color coordinate changes (Blue CIEy, By) by the current density changes in an organic light emitting diode fabricated in Examples or Comparative Examples.

As indicated in Table 5 as well as FIG. 13, in the OLED fabricated in Comparative Example 6 where the single-layered blue EML was applied, exciton recombination zone was generated at an interface between the EBL and the EML. A portion of exciton recombination zone was generated at the EBL in the low gradation range so that the luminous efficiency was low owing to the non-emitting or quenching excitons at the EBL. On the contrary, in the OLED fabricated in Examples 7 to 9 where two blue EMLs were applied, the exciton recombination zone was generated within the B-EML1 and B-EML2 in the low gradation range, and thus, luminous efficiency was increased and color was little changed owing to reduction of non-emitting excitons.

It will be apparent to those skilled in the art that various modifications and variations can be made in the present disclosure without departing from the scope of the disclosure. Thus, it is intended that the present disclosure cover the modifications and variations of the present disclosure provided they come within the scope of the appended claims.

What is claimed is:

1. An organic light emitting diode, comprising: a first electrode;

a second electrode facing the first electrode; and an emissive layer disposed between the first electrode and the second electrode, wherein the emissive layer comprises at least one emitting material layer, wherein the at least one emitting material layer comprises:

a first blue emitting material layer comprising a first host; and a second blue emitting material layer comprising a second host, wherein the second blue emitting material layer is disposed between the first blue emitting material layer and the second electrode, wherein the second blue emitting material layer is directly contacted to the first blue emitting material layer, wherein the first host comprises an organic compound having the following structure of Chemical Formula 1, wherein the second host comprises an organic compound having the following structure of Chemical Formula 3;

[Chemical Formula 1]

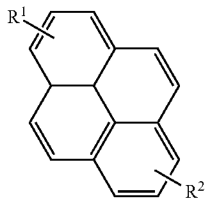

wherein, in the Chemical Formula 1, each of $R^1$ and $R^2$ is independently hydrogen, an unsubstituted or substituted $C_1$-$C_{20}$ alkyl group, an unsubstituted or substituted $C_6$-$C_{30}$ aryl group or an unsubstituted or substituted $C_3$-$C_{30}$ hetero aryl group,

[Chemical Formula 3]

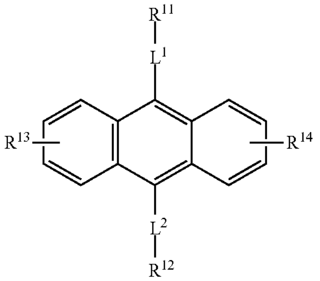

wherein, in the Chemical Formula 3, each of $R^{11}$ and $R^{12}$ is independently an unsubstituted or substituted $C_6$-$C_{30}$ aryl group or an unsubstituted or substituted $C_3$-$C_{30}$ hetero aryl group, each of $R^{13}$ and $R^{14}$ is independently hydrogen, an unsubstituted or substituted $C_1$-$C_{20}$ alkyl group, an unsubstituted or substituted $C_6$-$C_{30}$ aryl group or an unsubstituted or substituted $C_3$-$C_{30}$ hetero aryl group, and each of $L^1$ and $L^2$ is independently a single bond, an unsubstituted or substituted $C_6$-$C_{30}$ arylene group or an unsubstituted or substituted $C_3$-$C_{30}$ hetero arylene group.

2. The organic light emitting diode of claim 1, wherein in the Chemical Formula 1, each of $R^1$ and $R^2$ is independently hydrogen, methyl, ethyl, propyl, butyl, phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl or spiro-fluorenyl.

3. The organic light emitting diode of claim 1, wherein in the Chemical Formula 1, each of $R^1$ and $R^2$ is independently hydrogen, methyl, ethyl, propyl, butyl, pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzofuro-dibenzo-furanyl, benzothieno-benzo-thiophenyl, benzothieno-dibenzo-thiophenyl, benzo-thieno-benzo-furanyl, benzothieno-dibenzo-furanyl, xanthene-linked spiro acridinyl, dihydroacridinyl substituted with at least one $C_1$-$C_{10}$ alkyl or N-substituted spiro fluorenyl.

4. The organic light emitting diode of claim 1, wherein in the Chemical Formula 1, each of $R^1$ and $R^2$ is independently:

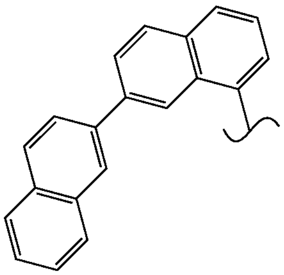,
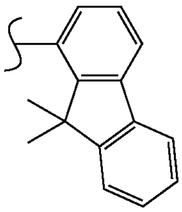,
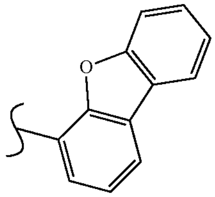,
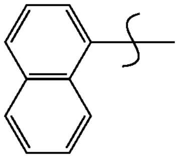,
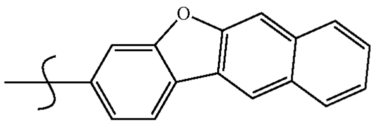,
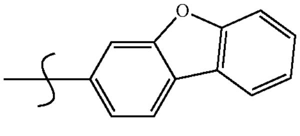,
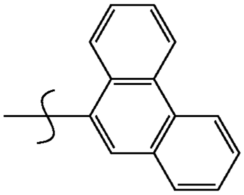,
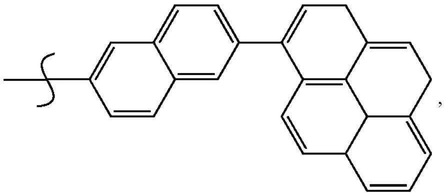,
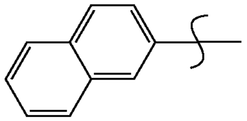,
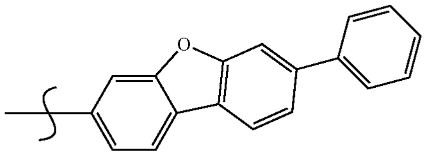,
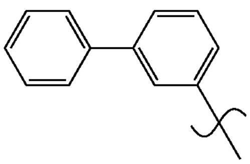,
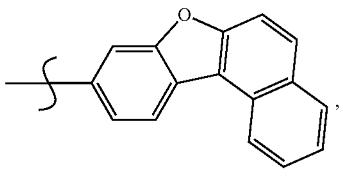, or -continued
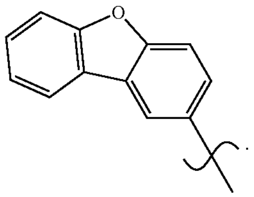
5. The organic light emitting diode of claim 1, wherein the first host is at least one of the following organic compounds:
BH1-1
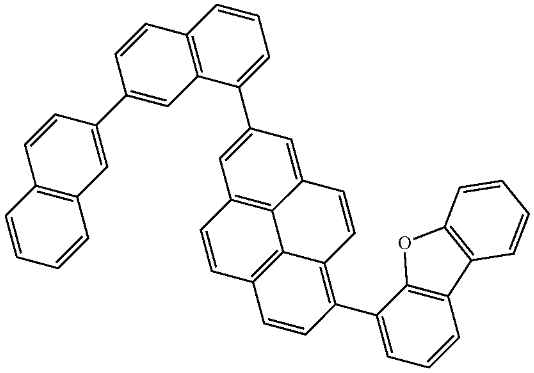
BH1-2
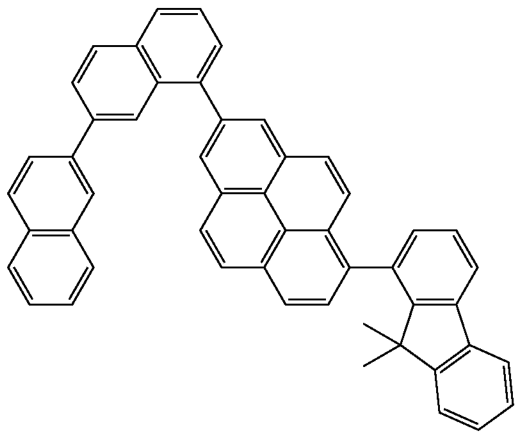
BH1-3
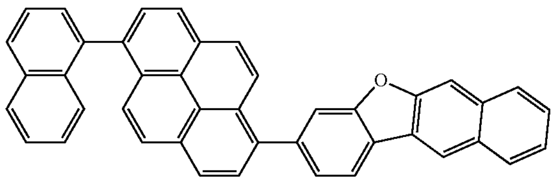
BH1-4
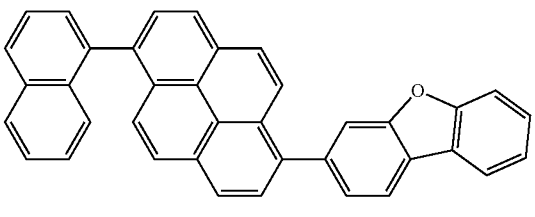
-continued
BH1-5
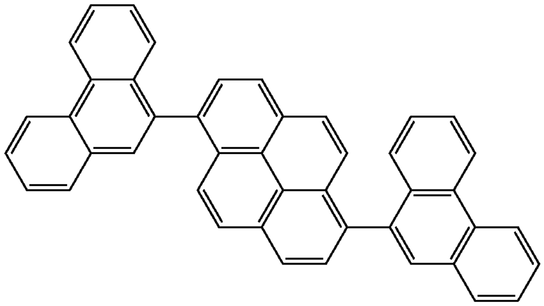
BH1-6
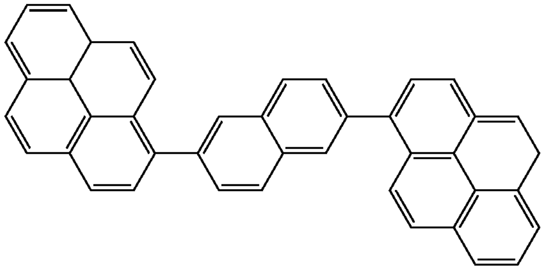
BH1-7
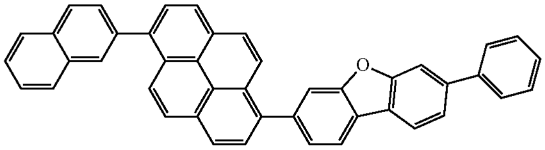
BH1-8
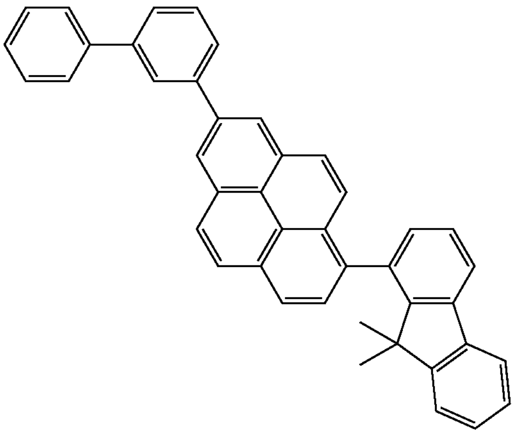
BH1-9
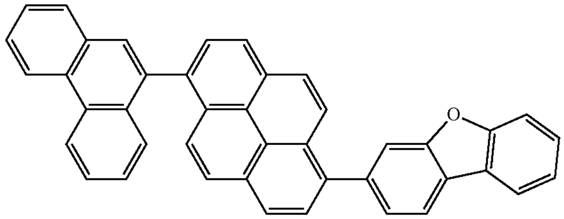

-continued

BH1-10

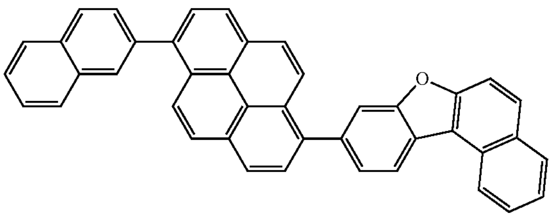

BH1-11

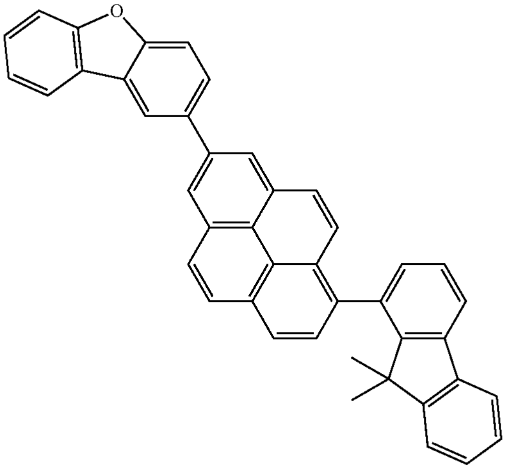

BH1-12

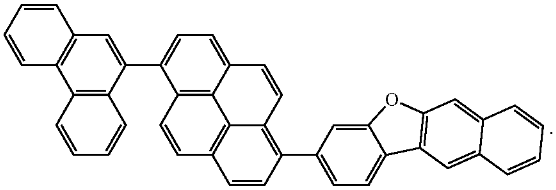

.

6. The organic light emitting diode of claim 1, wherein in the Chemical Formula 3, each of $R^{11}$ and $R^{12}$ is independently phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl, spiro-fluorenyl, pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzofuro-dibenzo-furanyl, benzothieno-benzo-thiophenyl, benzothieno-dibenzo-thiophenyl, benzo-thieno-benzo-furanyl, benzothieno-dibenzo-furanyl, xanthene-linked spiro acridinyl, or dihydroacridinyl.

7. The organic light emitting diode of claim 1, wherein in the Chemical Formula 3, each of $L^1$-$R^{11}$ is independently:

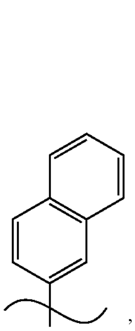

,

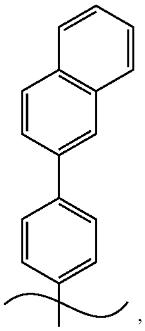

,

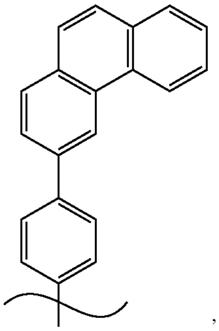

,

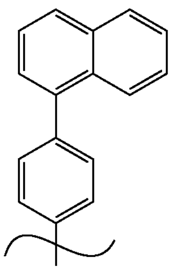

or

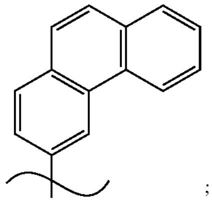

;

and wherein each of $L^2$-$R^{12}$ is independently:

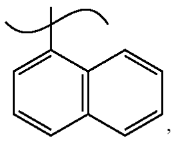

,

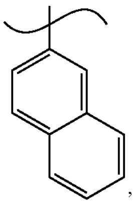

, or

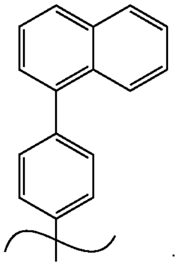

.

8. The organic light emitting diode of claim 1, wherein the second host is at least one of the following organic compounds:

-continued
BH2-1
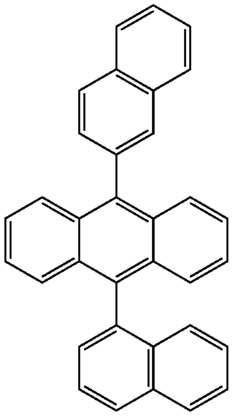
BH2-2
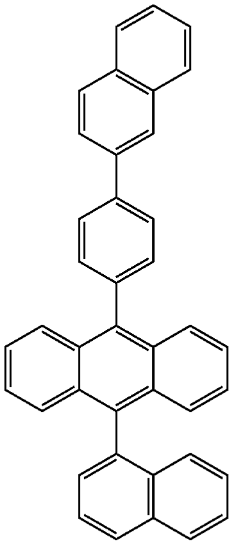
BH2-3
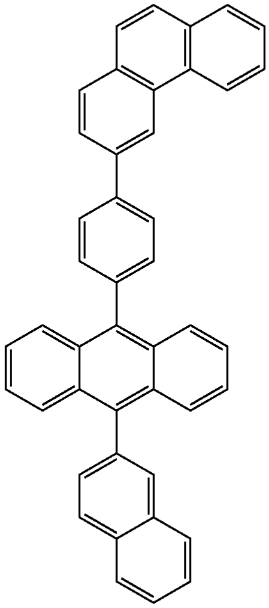
BH2-4
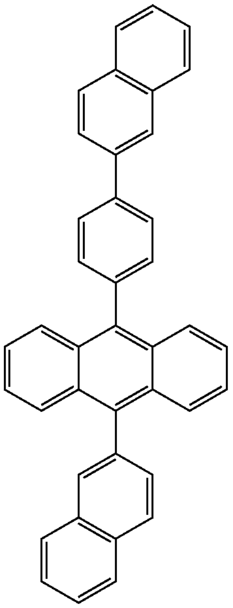
BH2-5
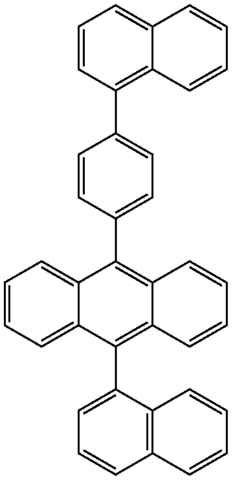
BH2-6
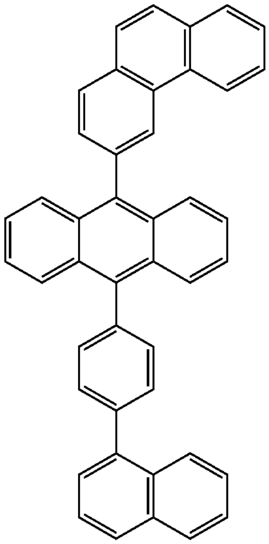

-continued

BH2-7

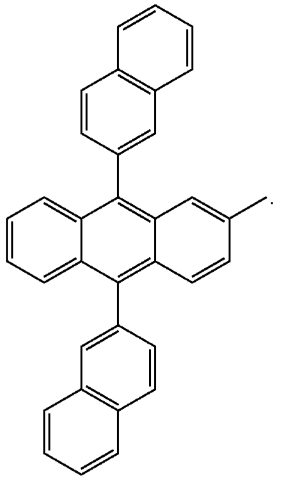

9. The organic light emitting diode of claim 1, wherein the emissive layer further comprises an electron blocking layer disposed between the first electrode and the at least one emitting material layer, and wherein the first host has a highest occupied molecular orbital energy level higher than a highest occupied molecular orbital energy level of the electron blocking layer.

10. The organic light emitting diode of claim 1, wherein the emissive layer has a single emitting part.

11. The organic light emitting diode of claim 1, wherein the emissive layer comprises: a first emitting part disposed between the first electrode and the second electrode;

a second emitting part disposed between the first emitting part and the second electrode; a third emitting part disposed between the second emitting part and the second electrode;

a first charge generation layer disposed between the first emitting part and the second emitting part; and a second charge generation layer disposed between the second emitting part and the third emitting part, and wherein at least one of the first emitting part, the second emitting part and the third emitting part comprises the at least one emitting material layer.

12. An organic light emitting device, comprising:

a substrate; and the organic light emitting diode of claim 1 over the substrate.

13. An organic light emitting diode, comprising:

a first electrode;

a second electrode; and an emissive layer disposed between the first electrode and the second electrode, wherein the emissive layer comprises:

a first emitting part disposed between the first electrode and the second electrode;

a second emitting part disposed between the first emitting part and the second electrode; a third emitting part disposed between the second emitting part and the second electrode;

a first charge generation layer disposed between the first emitting part and the second emitting part; and a second charge generation layer disposed between the second emitting part and the third emitting part, wherein the first emitting part comprises a first emitting material layer, wherein the second emitting part comprises a second emitting material layer, wherein the third emitting part comprises a third emitting material layer, wherein each of the first emitting material layer and the third emitting material layer comprises a blue emitting material layer, wherein the blue emitting material layer in the first emitting material layer and the third emitting material layer each independently comprise:

a first blue emitting material layer comprising a first host; and a second blue emitting material layer disposed between the first emitting material layer and the second electrode, and comprising a second host, wherein the second blue emitting material layer is directly contacted to the first blue emitting material layer, wherein the first host comprises an organic compound having the following structure of Chemical Formula 1, wherein the second host comprises an organic compound having the following structure of Chemical Formula 3:

[Chemical Formula 1]

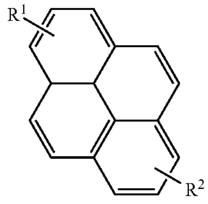

wherein, in the Chemical Formula 1, each of $R^1$ and $R^2$ is independently hydrogen, an unsubstituted or substituted $C_1$-$C_{20}$ alkyl group, an unsubstituted or substituted $C_6$-$C_{30}$ aryl group or an unsubstituted or substituted $C_3$-$C_{30}$ hetero aryl group,

[Chemical Formula 3]

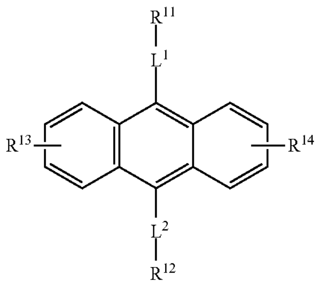

wherein, in the Chemical Formula 3, each of $R^{11}$ and $R^{12}$ is independently an unsubstituted or substituted $C_6$-$C_{30}$ aryl group or an unsubstituted or substituted $C_3$-$C_{30}$ hetero aryl group, each of $R^{13}$ and $R^{14}$ is independently hydrogen, an unsubstituted or substituted $C_1$-$C_{20}$ alkyl group, an unsubstituted or substituted $C_6$-$C_{30}$ aryl group or an unsubstituted or substituted $C_3$-$C_{30}$ hetero aryl group, and each of $L^1$ and $L^2$ is independently a single bond, an unsubstituted or substituted $C_6$-$C_{30}$ arylene group or an unsubstituted or substituted $C_3$-$C_{30}$ hetero arylene group.

14. The organic light emitting diode of claim 13, wherein in the Chemical Formula 1, each of $R^1$ and $R^2$ is independently hydrogen, methyl, ethyl, propyl, butyl, pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, dihydroacridinyl substituted with at least one $C_1$-$C_{10}$ alkyl or N-substituted spiro fluorenyl.

15. The organic light emitting diode of claim 13, wherein in the Chemical Formula 1, each of $R^1$ and $R^2$ is independently:

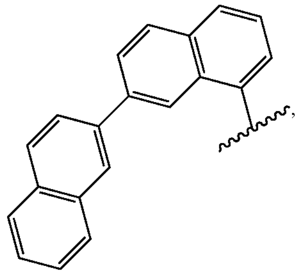
,
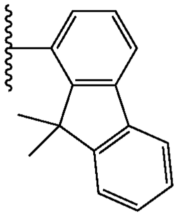
,
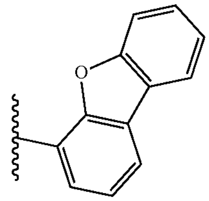
,
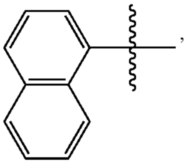
,
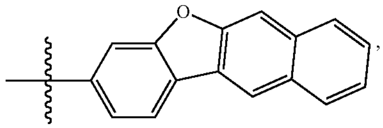
,
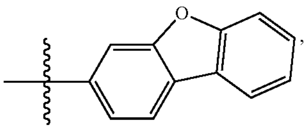
,
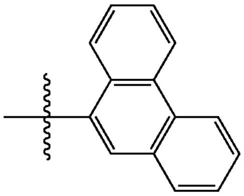
,
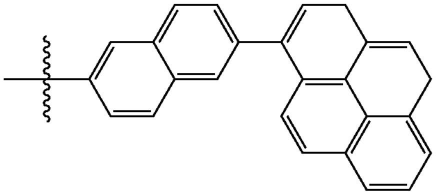
, -continued

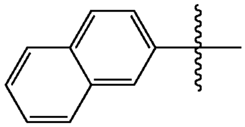
,
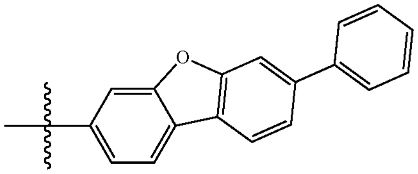
,
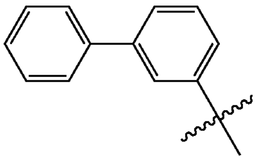
,
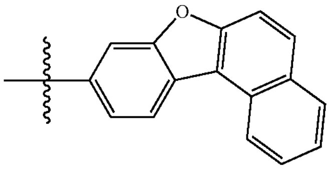
, or
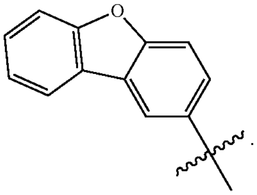
.

16. The organic light emitting diode of claim 13, wherein the first host is at least one of the following organic compounds:

BH1-1

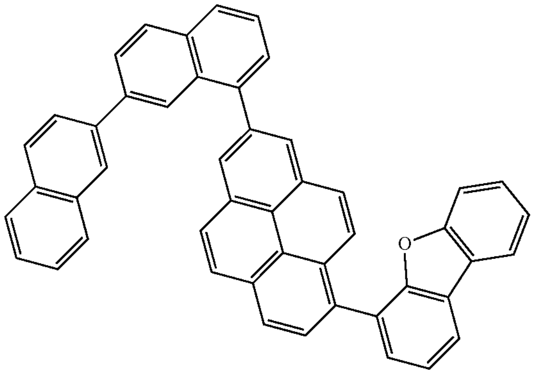

-continued
BH1-2
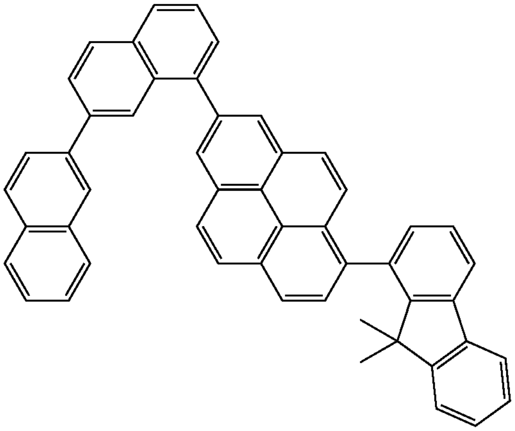
BH1-3
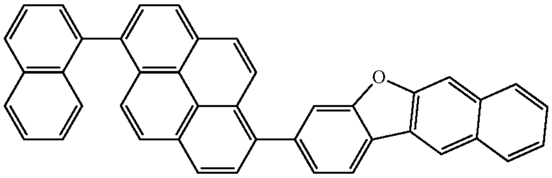
BH1-4
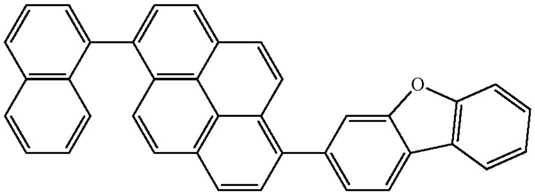
BH1-5
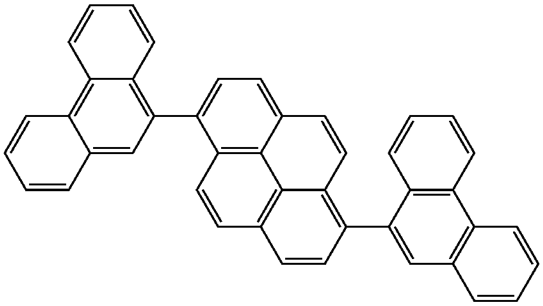
BH1-6
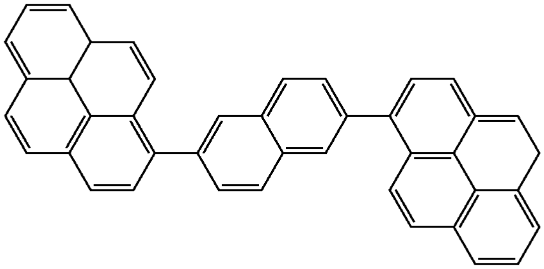
-continued
BH1-7
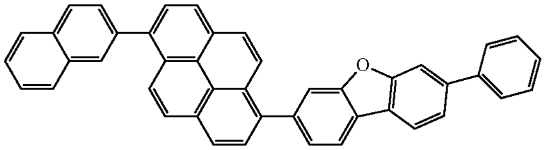
BH1-8
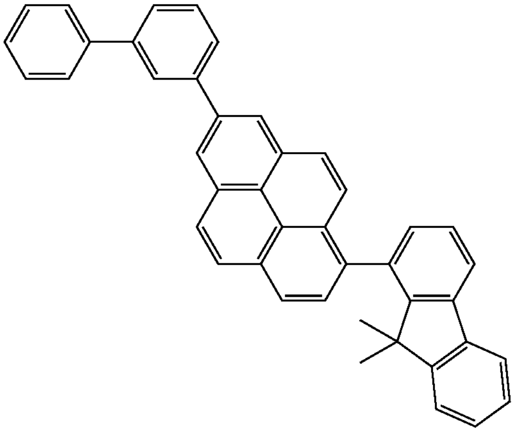
BH1-9
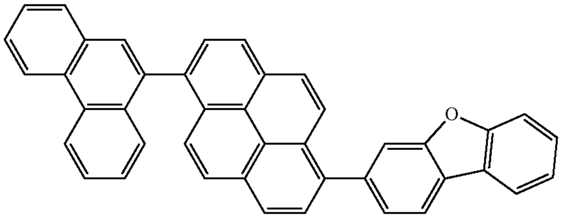
BH1-10
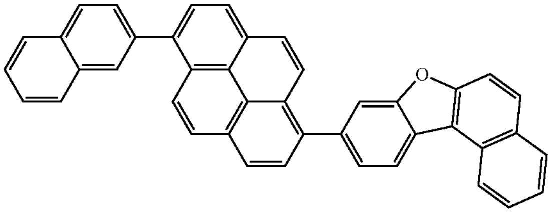
BH1-11
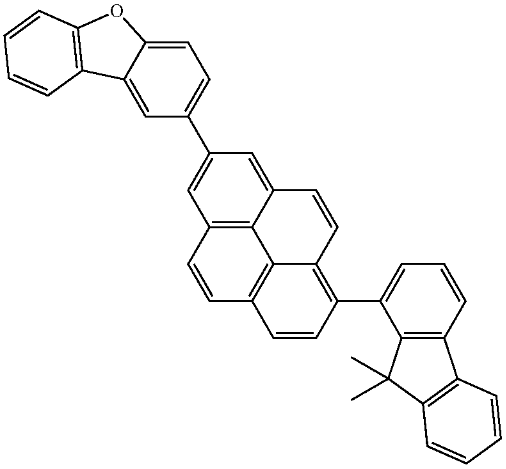

-continued

BH1-12

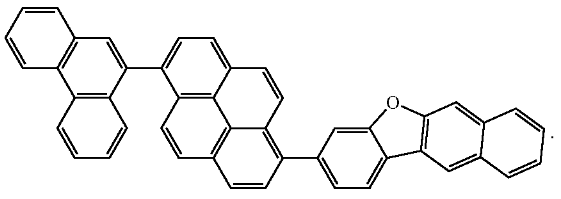

17. The organic light emitting diode of claim 13, wherein in Chemical Formula 3, each of $R^{11}$ and $R^{12}$ is independently phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl, spiro-fluorenyl, pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzofuro-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, or dihydroacridinyl.

18. The organic light emitting diode of claim 13, wherein in the Chemical Formula 3, each of $L^1$-$R^{11}$ is independently:

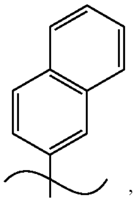
,
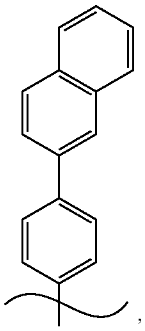
,
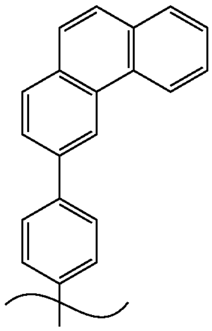
,
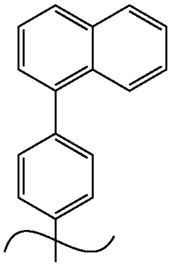
or
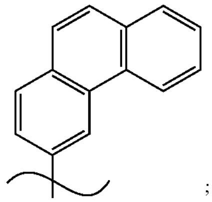
;

and wherein each of $L^2$-$R^{12}$ is independently:

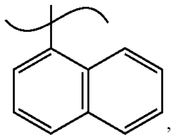
,
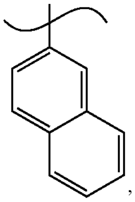
, or
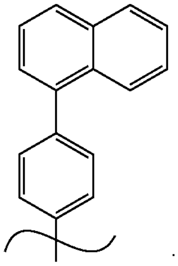
.

19. The organic light emitting diode of claim 13, wherein the second host is at least one of the following organic compounds:

BH2-1

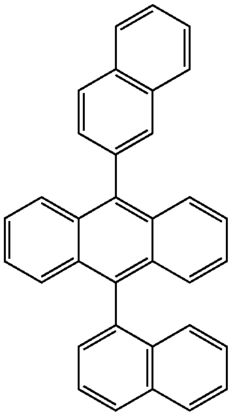

BH2-2

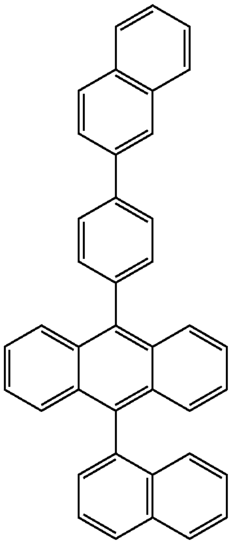

-continued
BH2-3
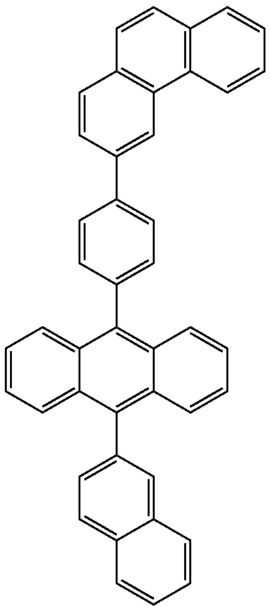
BH2-4
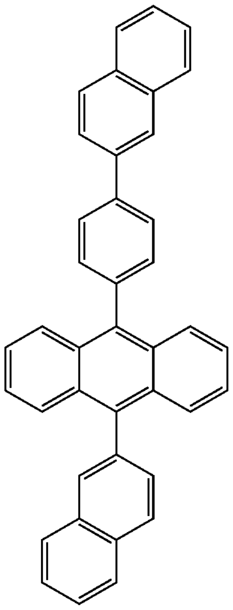
-continued
BH2-5
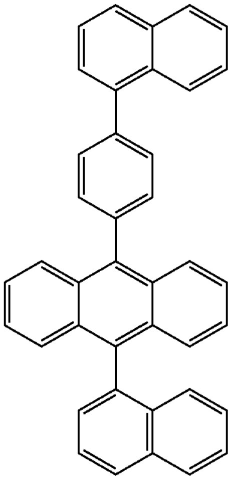
BH2-6
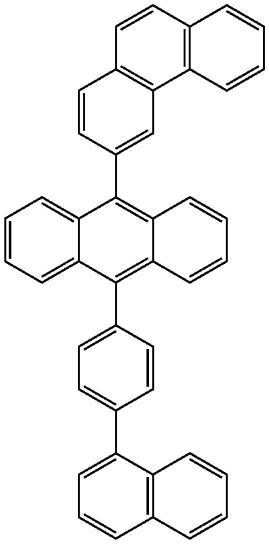
BH2-7
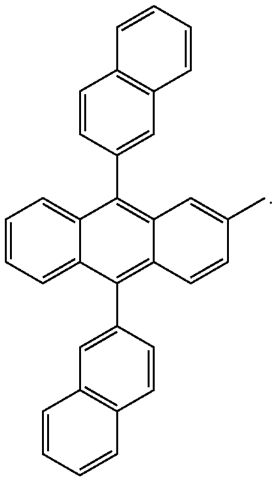
20. The organic light emitting diode of claim 13, wherein the first emitting part further comprises a first electron blocking layer disposed between the first electrode and the first emitting material layer, wherein the third emitting part further comprises a third electron blocking layer disposed between the second charge generation layer and the third emitting material layer, wherein the first host in the first blue emitting material layer of the first emitting material layer has a highest occupied molecular orbital energy level higher than a highest occupied molecular orbital energy level of the first electron blocking layer, and wherein the first host in the first blue emitting material layer of the third emitting material layer has a highest occupied molecular orbital energy level higher than a highest occupied molecular orbital energy level of the third electron blocking layer.

21. An organic light emitting device, comprising:

a substrate; and the organic light emitting diode of claim 13 over the substrate.

* * * * *